(12) United States Patent
Elolampi et al.

(10) Patent No.: US 9,723,711 B2
(45) Date of Patent: Aug. 1, 2017

(54) METHOD FOR FABRICATING A FLEXIBLE ELECTRONIC STRUCTURE AND A FLEXIBLE ELECTRONIC STRUCTURE

(71) Applicant: MC10, Inc., Lexington, MA (US)

(72) Inventors: Brian David Elolampi, Belmont, MA (US); Roozbeh Ghaffari, Cambridge, MA (US); Bassel de Graff, San Juan (TT); William J. Arora, Bellevue, WA (US); Xiaolong Hu, Cambridge, MA (US)

(73) Assignee: MC10, Inc., Lexington, MA (US)

( * ) Notice: Subject to any disclaimer, the term of this patent is extended or adjusted under 35 U.S.C. 154(b) by 16 days.

(21) Appl. No.: 14/819,040

(22) Filed: Aug. 5, 2015

(65) Prior Publication Data

US 2015/0342036 A1 Nov. 26, 2015

Related U.S. Application Data

(63) Continuation of application No. 13/481,843, filed on May 27, 2012, now Pat. No. 9,159,635.
(Continued)

(51) Int. Cl.
*H05K 1/02* (2006.01)
*H01L 21/683* (2006.01)
(Continued)

(52) U.S. Cl.
CPC ....... *H05K 1/0278* (2013.01); *H01L 21/6835* (2013.01); *H01L 23/13* (2013.01);
(Continued)

(58) Field of Classification Search
CPC . H01L 21/6835; H01L 23/4985; H01L 23/13; H05K 1/0278
See application file for complete search history.

(56) References Cited

U.S. PATENT DOCUMENTS 3,716,861 A   2/1973   Root
3,805,427 A   4/1974   Epstein
(Continued)

FOREIGN PATENT DOCUMENTS

EP   0585670 A2   3/1994
EP   2259062 A2   12/2010
(Continued)

OTHER PUBLICATIONS

European Search Report corresponding to co-pending European Patent Application Serial No. 12793583.1, European Patent Office, dated Aug. 8, 2015; (8 pages).
(Continued)

*Primary Examiner* — Jose R Diaz
(74) *Attorney, Agent, or Firm* — Nixon Peabody LLP

(57) ABSTRACT

Flexible electronic structure and methods for fabricating flexible electronic structures are provided. An example method includes applying a first layer to a substrate, creating a plurality of vias through the first layer to the substrate, and applying a second polymer layer to the first layer such that the second polymer forms anchors contacting at least a portion of the substrate. At least one electronic device layer is disposed on a portion of the second polymer layer. At least one trench is formed through the second polymer layer to expose at least a portion of the first layer. At least a portion of the first layer is removed by exposing the structure to a selective etchant to providing a flexible electronic structure that is in contact with the substrate. The electronic structure can be released from the substrate.

54 Claims, 24 Drawing Sheets

Related U.S. Application Data

(60) Provisional application No. 61/490,826, filed on May 27, 2011.

(51) Int. Cl.
  H05K 3/46 (2006.01)
  H05K 3/06 (2006.01)
  H05K 1/11 (2006.01)
  H05K 1/03 (2006.01)
  H01L 23/13 (2006.01)
  H01L 25/065 (2006.01)
  H01L 25/07 (2006.01)
  H01L 25/00 (2006.01)
  H01L 23/498 (2006.01)
  H01L 23/538 (2006.01)

(52) U.S. Cl.
  CPC ...... *H01L 23/4985* (2013.01); *H01L 25/0655* (2013.01); *H01L 25/072* (2013.01); *H01L 25/50* (2013.01); *H05K 1/0326* (2013.01); *H05K 1/0346* (2013.01); *H05K 1/115* (2013.01); *H05K 3/067* (2013.01); *H05K 3/4644* (2013.01); *H01L 23/5389* (2013.01); *H01L 2221/6835* (2013.01); *H01L 2221/68318* (2013.01); *H01L 2221/68368* (2013.01); *H01L 2221/68381* (2013.01); *H01L 2224/24137* (2013.01); *H01L 2224/73267* (2013.01); *H01L 2224/92244* (2013.01); *H01L 2924/1461* (2013.01); *H05K 2201/0141* (2013.01); *H05K 2201/0145* (2013.01); *H05K 2201/0154* (2013.01)

(56) References Cited

U.S. PATENT DOCUMENTS

| | | |
|---|---|---|
| 4,304,235 A | 12/1981 | Kaufman |
| 4,416,288 A | 11/1983 | Freeman |
| 4,658,153 A | 4/1987 | Brosh |
| 4,900,878 A | 2/1990 | Ichkhan |
| 5,306,917 A | 4/1994 | Black |
| 5,326,521 A | 7/1994 | East |
| 5,331,966 A | 7/1994 | Bennett |
| 5,360,987 A | 11/1994 | Shibib |
| 5,454,270 A | 10/1995 | Brown |
| 5,491,651 A | 2/1996 | Janic |
| 5,567,975 A | 10/1996 | Walsh |
| 5,617,870 A | 4/1997 | Hastings |
| 5,811,790 A | 9/1998 | Endo |
| 5,817,008 A | 10/1998 | Rafert |
| 5,907,477 A | 5/1999 | Tuttle |
| 6,063,046 A | 5/2000 | Allum |
| 6,282,960 B1 | 9/2001 | Samuels et al. |
| 6,287,517 B1 | 9/2001 | Ackley et al. |
| 6,343,514 B1 | 2/2002 | Smith |
| 6,387,052 B1 | 5/2002 | Quinn |
| 6,421,016 B1 | 7/2002 | Phillips |
| 6,567,158 B1 | 5/2003 | Falcial |
| 6,641,860 B1 | 11/2003 | Kaiserman |
| 6,743,982 B2 | 6/2004 | Biegelsen et al. |
| 6,784,844 B1 | 8/2004 | Boakes |
| 6,965,160 B2 | 11/2005 | Cobbley |
| 6,987,314 B1 | 1/2006 | Yoshida |
| 7,259,030 B2 | 8/2007 | Daniels |
| 7,265,298 B2 | 9/2007 | Maghribi |
| 7,302,751 B2 | 12/2007 | Hamburgen |
| 7,337,012 B2 | 2/2008 | Maghribi |
| 7,487,587 B2 | 2/2009 | Vanfleteren |
| 7,491,892 B2 | 2/2009 | Wagner |
| 7,521,292 B2 | 4/2009 | Rogers |
| 7,557,367 B2 | 7/2009 | Rogers |
| 7,618,260 B2 | 11/2009 | Daniel |
| 7,622,367 B1 | 11/2009 | Nuzzo |
| 7,727,228 B2 | 6/2010 | Abboud |
| 7,739,791 B2 | 6/2010 | Brandenburg |
| 7,759,167 B2 | 7/2010 | Vanfleteren |
| 7,960,246 B2 | 6/2011 | Flamand |
| 7,982,296 B2 | 7/2011 | Nuzzo |
| 8,097,926 B2 | 1/2012 | De Graff |
| 8,198,621 B2 | 6/2012 | Rogers |
| 8,207,473 B2 | 6/2012 | Axisa |
| 8,217,381 B2 | 7/2012 | Rogers |
| 8,372,726 B2 | 2/2013 | De Graff |
| 8,389,862 B2 | 3/2013 | Arora |
| 8,431,828 B2 | 4/2013 | Vanfleteren |
| 8,440,546 B2 | 5/2013 | Nuzzo |
| 8,536,667 B2 | 9/2013 | De Graff |
| 8,552,299 B2 | 10/2013 | Rogers |
| 8,664,699 B2 | 3/2014 | Nuzzo |
| 8,679,888 B2 | 3/2014 | Rogers |
| 8,729,524 B2 | 5/2014 | Rogers |
| 8,754,396 B2 | 6/2014 | Rogers |
| 8,865,489 B2 | 10/2014 | Rogers |
| 8,886,334 B2 | 11/2014 | Ghaffari |
| 8,905,772 B2 | 12/2014 | Rogers |
| 9,012,784 B2 | 4/2015 | Arora |
| 9,082,025 B2 | 7/2015 | Fastert et al. |
| 9,105,555 B2 | 8/2015 | Rogers |
| 9,105,782 B2 | 8/2015 | Rogers |
| 9,119,533 B2 | 9/2015 | Ghaffari |
| 9,123,614 B2 | 9/2015 | Graff et al. |
| 9,159,635 B2 | 10/2015 | Elolampi et al. |
| 9,168,094 B2 | 10/2015 | Lee et al. |
| 9,171,794 B2 | 10/2015 | Rafferty et al. |
| 2001/0012918 A1 | 8/2001 | Swanson |
| 2001/0021867 A1 | 9/2001 | Kordis |
| 2002/0026127 A1 | 2/2002 | Balbierz |
| 2002/0082515 A1 | 6/2002 | Campbell |
| 2002/0094701 A1 | 7/2002 | Biegelsen |
| 2002/0113739 A1 | 8/2002 | Howard |
| 2002/0128700 A1 | 9/2002 | Cross, Jr. |
| 2002/0151934 A1 | 10/2002 | Levine |
| 2002/0158330 A1 | 10/2002 | Moon |
| 2003/0017848 A1 | 1/2003 | Engstrom |
| 2003/0045025 A1 | 3/2003 | Coyle |
| 2003/0097165 A1 | 5/2003 | Krulevitch |
| 2003/0162507 A1 | 8/2003 | Vatt |
| 2003/0214408 A1 | 11/2003 | Grajales |
| 2003/0236455 A1 | 12/2003 | Swanson |
| 2004/0006264 A1 | 1/2004 | Mojarradi |
| 2004/0092806 A1 | 5/2004 | Sagon |
| 2004/0106334 A1 | 6/2004 | Suzuki |
| 2004/0135094 A1 | 7/2004 | Niigaki |
| 2004/0138558 A1 | 7/2004 | Dunki-Jacobs |
| 2004/0149921 A1 | 8/2004 | Smyk |
| 2004/0178466 A1 | 9/2004 | Merrill |
| 2004/0201134 A1 | 10/2004 | Kawai |
| 2004/0203486 A1 | 10/2004 | Shepherd |
| 2004/0221370 A1 | 11/2004 | Hannula |
| 2004/0243204 A1 | 12/2004 | Maghribi |
| 2005/0021103 A1 | 1/2005 | DiLorenzo |
| 2005/0067293 A1 | 3/2005 | Naito |
| 2005/0070778 A1 | 3/2005 | Lackey |
| 2005/0096513 A1 | 5/2005 | Ozguz |
| 2005/0113744 A1 | 5/2005 | Donoghue |
| 2005/0139683 A1 | 6/2005 | Yi |
| 2005/0171524 A1 | 8/2005 | Stern |
| 2005/0203366 A1 | 9/2005 | Donoghue |
| 2006/0003709 A1 | 1/2006 | Wood |
| 2006/0038182 A1 | 2/2006 | Rogers |
| 2006/0084394 A1 | 4/2006 | Engstrom |
| 2006/0106321 A1 | 5/2006 | Lewinsky |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |

(56) References Cited

U.S. PATENT DOCUMENTS

| | | |
|---|---|---|
| 2007/0113399 A1 | 5/2007 | Kumar |
| 2007/0123756 A1 | 5/2007 | Kitajima |
| 2007/0270672 A1 | 11/2007 | Hayter |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0193749 A1 | 8/2008 | Thompson |
| 2008/0204021 A1 | 8/2008 | Leussler |
| 2008/0211087 A1 | 9/2008 | Mueller-Hipper |
| 2008/0237840 A1 | 10/2008 | Alcoe |
| 2008/0259576 A1 | 10/2008 | Johnson |
| 2008/0287167 A1 | 11/2008 | Caine |
| 2008/0313552 A1 | 12/2008 | Buehler |
| 2009/0000377 A1 | 1/2009 | Shipps |
| 2009/0001550 A1 | 1/2009 | Li et al. |
| 2009/0015560 A1 | 1/2009 | Robinson |
| 2009/0017884 A1 | 1/2009 | Rotschild |
| 2009/0048556 A1 | 2/2009 | Durand |
| 2009/0088750 A1 | 4/2009 | Hushka |
| 2009/0107704 A1 | 4/2009 | Vanfleteren |
| 2009/0154736 A1 | 6/2009 | Lee |
| 2009/0184254 A1 | 7/2009 | Miura |
| 2009/0215385 A1 | 8/2009 | Waters |
| 2009/0225751 A1 | 9/2009 | Koenck |
| 2009/0261828 A1 | 10/2009 | Nordmeyer-Massner |
| 2009/0264972 A1 | 10/2009 | Zhou et al. |
| 2009/0273909 A1 | 11/2009 | Shin |
| 2009/0291508 A1 | 11/2009 | Babu |
| 2009/0294803 A1 | 12/2009 | Nuzzo |
| 2009/0322480 A1 | 12/2009 | Benedict |
| 2010/0002402 A1 | 1/2010 | Rogers et al. |
| 2010/0059863 A1 | 3/2010 | Rogers |
| 2010/0072577 A1 | 3/2010 | Nuzzo |
| 2010/0073669 A1 | 3/2010 | Colvin |
| 2010/0087782 A1 | 4/2010 | Ghaffari |
| 2010/0090781 A1 | 4/2010 | Yamamoto |
| 2010/0090824 A1 | 4/2010 | Rowell |
| 2010/0116526 A1 | 5/2010 | Arora |
| 2010/0117660 A1 | 5/2010 | Douglas |
| 2010/0178722 A1 | 7/2010 | De Graff |
| 2010/0245011 A1 | 9/2010 | Chatzopoulos |
| 2010/0271191 A1 | 10/2010 | De Graff |
| 2010/0298895 A1 | 11/2010 | Ghaffari |
| 2010/0317132 A1 | 12/2010 | Rogers |
| 2010/0321161 A1 | 12/2010 | Isabell |
| 2010/0327387 A1 | 12/2010 | Kasai |
| 2011/0011179 A1 | 1/2011 | Gustafsson |
| 2011/0034912 A1 | 2/2011 | De Graff |
| 2011/0051384 A1 | 3/2011 | Kriechbaum |
| 2011/0054583 A1 | 3/2011 | Litt |
| 2011/0101789 A1 | 5/2011 | Salter |
| 2011/0121822 A1 | 5/2011 | Parsche |
| 2011/0140897 A1 | 6/2011 | Purks |
| 2011/0175735 A1 | 7/2011 | Forster |
| 2011/0184320 A1 | 7/2011 | Shipps |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0277813 A1 | 11/2011 | Rogers |
| 2011/0306851 A1 | 12/2011 | Wang |
| 2012/0016258 A1 | 1/2012 | Webster |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0087216 A1 | 4/2012 | Keung |
| 2012/0091594 A1 | 4/2012 | Landesberger |
| 2012/0092178 A1 | 4/2012 | Callsen |
| 2012/0092222 A1 | 4/2012 | Kato |
| 2012/0101413 A1 | 4/2012 | Beetel |
| 2012/0101538 A1 | 4/2012 | Ballakur |
| 2012/0108012 A1 | 5/2012 | Yasuda |
| 2012/0157804 A1 | 6/2012 | Rogers |
| 2012/0172697 A1 | 7/2012 | Urman |
| 2012/0226130 A1 | 9/2012 | De Graff |
| 2012/0244848 A1 | 9/2012 | Ghaffari |
| 2012/0256308 A1 | 10/2012 | Helin |
| 2012/0316455 A1 | 12/2012 | Rahman |
| 2012/0327608 A1 | 12/2012 | Rogers |
| 2013/0041235 A1 | 2/2013 | Rogers |
| 2013/0099358 A1 | 4/2013 | Elolampi |
| 2013/0100618 A1 | 4/2013 | Rogers |
| 2013/0118255 A1 | 5/2013 | Callsen |
| 2013/0150693 A1 | 6/2013 | D'angelo |
| 2013/0185003 A1 | 7/2013 | Carbeck |
| 2013/0192356 A1 | 8/2013 | De Graff |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0274562 A1 | 10/2013 | Ghaffari |
| 2013/0313713 A1 | 11/2013 | Arora |
| 2013/0316442 A1 | 11/2013 | Meurville |
| 2013/0316487 A1 | 11/2013 | De Graff |
| 2013/0320503 A1 | 12/2013 | Nuzzo |
| 2013/0321373 A1 | 12/2013 | Yoshizumi |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0140020 A1 | 5/2014 | Rogers |
| 2014/0188426 A1 | 7/2014 | Fastert |
| 2014/0191236 A1 | 7/2014 | Nuzzo |
| 2014/0216524 A1 | 8/2014 | Rogers |
| 2014/0240932 A1 | 8/2014 | Hsu |
| 2014/0249520 A1 | 9/2014 | Ghaffari |
| 2014/0303452 A1 | 10/2014 | Ghaffari |
| 2014/0340857 A1 | 11/2014 | Hsu |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0035680 A1 | 2/2015 | Li |
| 2015/0069617 A1 | 3/2015 | Arora et al. |
| 2015/0099976 A1 | 4/2015 | Ghaffari et al. |
| 2015/0100135 A1 | 4/2015 | Ives |
| 2015/0194817 A1 | 7/2015 | Lee et al. |
| 2015/0237711 A1 | 8/2015 | Rogers |
| 2015/0241288 A1 | 8/2015 | Keen et al. |
| 2015/0260713 A1 | 9/2015 | Ghaffari et al. |

FOREIGN PATENT DOCUMENTS

| | | |
|---|---|---|
| JP | 05-087511 A | 4/1993 |
| JP | 2008004795 | 1/2008 |
| JP | 2009-170173 A | 7/2009 |
| JP | 2010517265 | 5/2010 |
| JP | 2010225668 | 10/2010 |
| WO | WO 2005/122285 A2 | 12/2005 |
| WO | WO 2007/003019 A2 | 1/2007 |
| WO | WO 2007/136726 A2 | 11/2007 |
| WO | WO 2008/030960 A2 | 3/2008 |
| WO | WO 2008/143635 | 11/2008 |
| WO | WO 2009/111641 A1 | 9/2009 |
| WO | WO 2009/114689 A1 | 9/2009 |
| WO | WO 2010/036807 A1 | 4/2010 |
| WO | WO 2010/042653 A1 | 4/2010 |
| WO | WO 2010/042957 A2 | 4/2010 |
| WO | WO 2010/046883 A1 | 4/2010 |
| WO | WO 2010/056857 A2 | 5/2010 |
| WO | WO 2010/081137 A2 | 7/2010 |
| WO | WO 2010/082993 A2 | 7/2010 |
| WO | WO 2010/102310 A2 | 9/2010 |
| WO | WO 2010/132552 A1 | 11/2010 |
| WO | WO 2011/003181 A1 | 1/2011 |

(56) References Cited

FOREIGN PATENT DOCUMENTS

| WO | WO 2011/041727 A1 | 4/2011 |
|---|---|---|
| WO | WO 2011/084450 A1 | 7/2011 |
| WO | WO 2011/084709 A2 | 7/2011 |
| WO | WO 2011/127331 A2 | 10/2011 |
| WO | WO 2012/125494 A2 | 9/2012 |
| WO | WO 2012/166686 A2 | 12/2012 |
| WO | WO 2013/010171 A1 | 1/2013 |
| WO | WO 2013/022853 A1 | 2/2013 |
| WO | WO 2013/033724 A1 | 3/2013 |
| WO | WO 2013/034987 A3 | 3/2013 |
| WO | WO 2013/049716 A1 | 4/2013 |
| WO | WO 2013/052919 A2 | 4/2013 |
| WO | WO 2013/170032 A2 | 11/2013 |
| WO | WO 2014/007871 A1 | 1/2014 |
| WO | WO 2014/058473 A1 | 4/2014 |
| WO | WO 2014/059032 A1 | 4/2014 |
| WO | WO 2014/106041 A1 | 7/2014 |
| WO | WO 2014/110176 A1 | 7/2014 |
| WO | WO 2014/130928 A2 | 8/2014 |
| WO | WO 2014/130931 A1 | 8/2014 |
| WO | WO 2014/186467 A2 | 11/2014 |
| WO | WO 2014/197443 A1 | 12/2014 |
| WO | WO 2014/205434 A2 | 12/2014 |
| WO | WO 2015/021039 A1 | 2/2015 |
| WO | WO 2015/054312 A1 | 4/2015 |
| WO | WO 2015/077559 A1 | 5/2015 |
| WO | WO 2015/080991 A1 | 6/2015 |
| WO | WO 2015/102951 A2 | 7/2015 |
| WO | WO 2015/103483 A1 | 7/2015 |
| WO | WO 2015/103580 A2 | 7/2015 |
| WO | WO 2015/127458 A1 | 8/2015 |
| WO | WO 2015/134588 A1 | 9/2015 |
| WO | WO 2015/138712 A1 | 9/2015 |

OTHER PUBLICATIONS

Office Action in Japanese Patent Application No. JP 2014-512179 dated Mar. 1, 2016 (9 pages with English Translation).

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto et al., "A New Route for Silk," Nature Photonics, vol. 2, 641-643 (3 pages) (Nov. 2008).

Omenetto et al., "New Opportunities for an Ancient Material," Science, vol. 329, 528-531 (5 pages) (Jul. 30, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008).

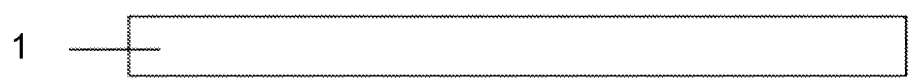
FIG. 1
FIG. 2
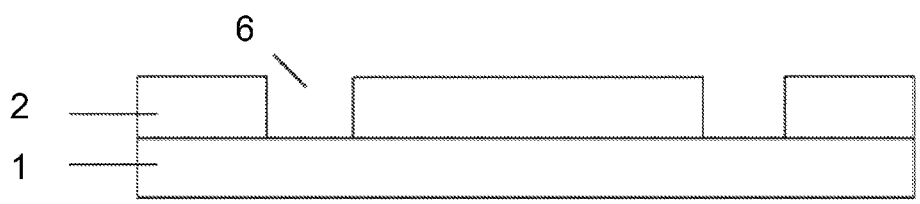
FIG. 3
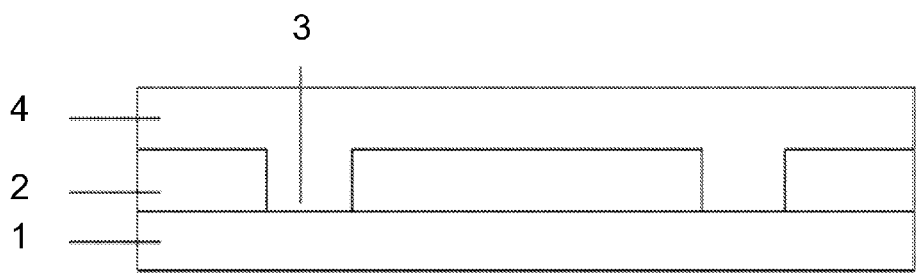
FIG. 4
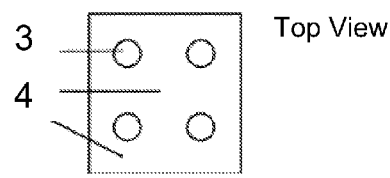
Top View

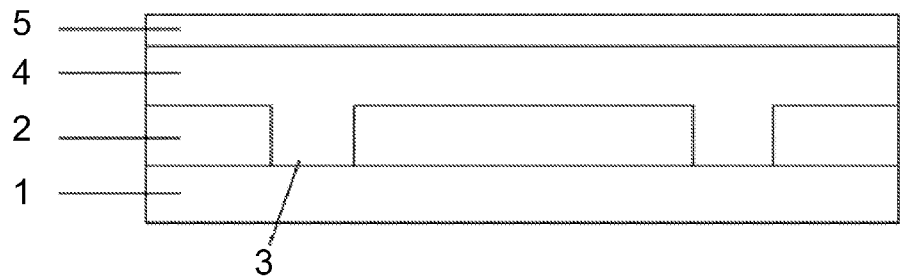
*FIG. 5*
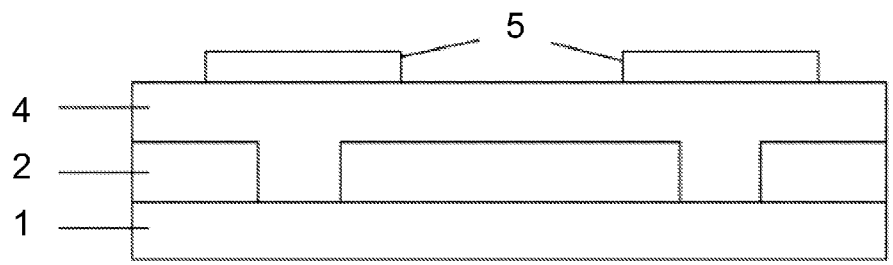
*FIG. 6*
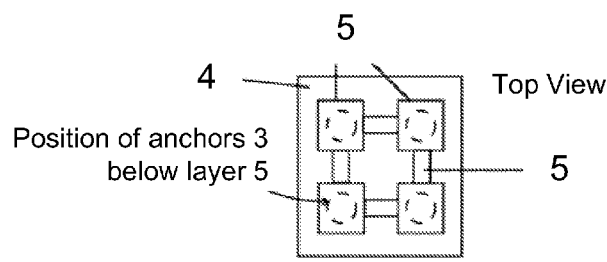
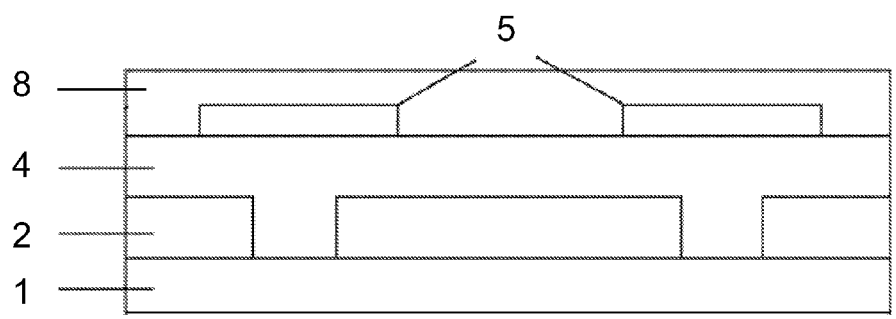
*FIG. 7*

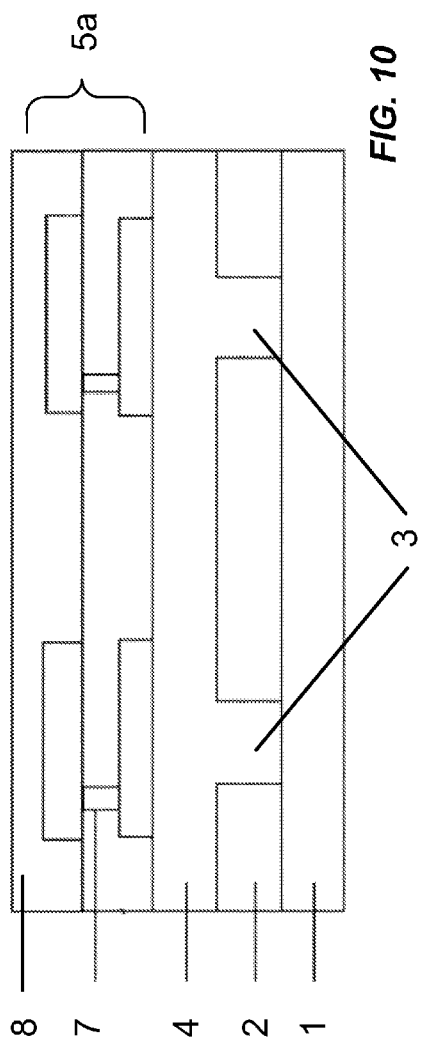
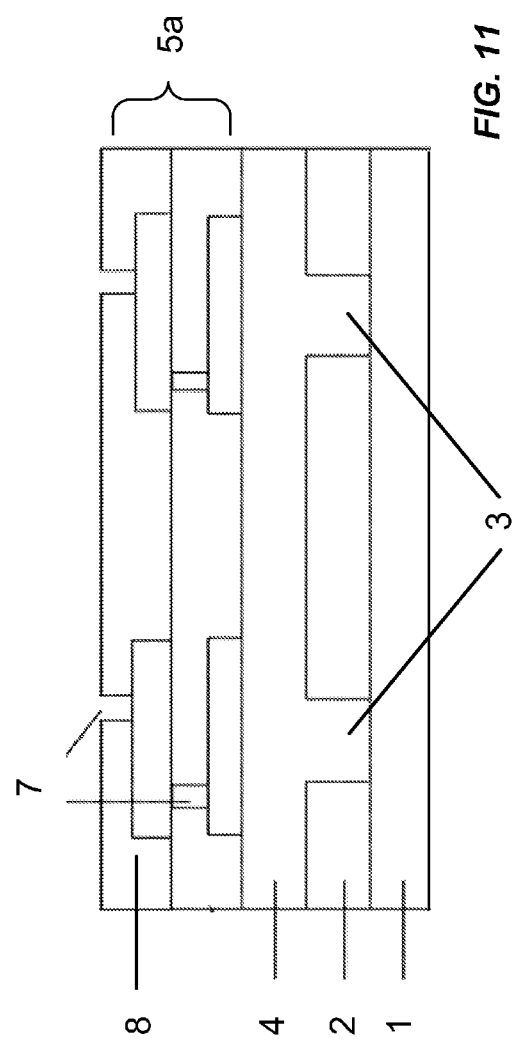

METHOD FOR FABRICATING A FLEXIBLE ELECTRONIC STRUCTURE AND A FLEXIBLE ELECTRONIC STRUCTURE

CROSS REFERENCE TO RELATED APPLICATIONS

This application is a continuation of U.S. patent application Ser. No. 13/481,843, filed May 27, 2012, which claims priority to and the benefit of U.S. Provisional Application No. 61/490,826, filed on May 27, 2011, entitled "METHODS FOR FABRICATING ELECTRONIC, OPTICAL AND/OR MECHANICAL APPARATUS AND SYSTEMS" both of which are incorporated herein by reference in their entireties.

BACKGROUND

Flexible electronics are expected to revolutionize the next generation of devices. Due to the high degree of flexibility of flexible electronics, they can be integrated into many different shapes. This flexibility and diverse integration options can provide for a large number of useful device configurations that would not be possible with the more rigid electronics that are fabricated based on silicon. Applications envisioned for flexible electronics include thin, flexible mobile devices, bendable and conformable displays, rollable and foldable flexible displays, and paper-like displays. Additionally, new forms of flexible electronic enable significant strain or stretch.

Some portions of such flexible electronics may be fabricated in solution. In addition, flexible substrates may be used in the fabrication of the flexible electronics. The flexible substrates enable fabrication by high speed printing techniques capable of generating electronic devices over large substrate at low cost. The flexible electronics also may be fabricated using independent fabricated components followed by assembly onto a single device substrate.

Fabricating flexible electronics that exhibit good electronic performance can be challenging. For example, fabrication techniques developed for the semiconductor fabrication industry are incompatible with some flexible materials. The temperatures used to generate high quality inorganic semiconductor components (for example, temperatures greater than 1000 degrees Celsius) are incompatible with many polymers, plastics and elastomeric materials. In addition, inorganic semiconductors are poorly soluble in the types of solvents that facilitate formation of the flexible electronics. While amorphous forms of silicon are fabricated using lower temperatures, it may not be compatible with the flexible electronic structure. Organic or hybrid organic-inorganic semiconductors can be processed at relatively low temperatures; however these materials do not form electronic structures with the performance capability needed for the next generation of flexible, foldable and bendable products.

Flexible electronics may be formed through incorporating inorganic semiconductor components into a polymer-based matrix. The flexible electronics can be fabricated on a rigid substrate or a flexible substrate. At one or more stages in the fabrication process, the flexible electronics is subjected to processing in solvents that are incompatible with the inorganic components. Therefore, polymer encapsulation of the inorganic device components has been suggested.

A challenge to large-scale production of the flexible electronics is the difficulty with separating the fabricated flexible electronics from the substrate on which the flexible electronics are fabricated. Mechanical removal may damage the flexible electronics by introducing stresses in the structure. Many chemical-based methods of separating the fabricated flexible electronics from the support substrate can cause damage to the flexible electronics.

SUMMARY

In view of the foregoing, the Inventors have recognized and appreciated various significant improvements to fabrication processes for flexible electronics that facilitate higher yield and generally improve the integrity of electronics devices resulting from the fabrication process. One example of such an improvement involves a "sacrificial release layer" disposed on a substrate on which some portion of the flexible electronics are fabricated. In particular, the Inventors have recognized and appreciated that, when fabricating electronic, optical, or mechanical systems, it is desirable to construct the system over a substrate that has a sacrificial release layer disposed on its surface. In one exemplary implementation illustrating the inventive concepts disclosed herein, such an electronic, optical and/or mechanical system is built (i.e., fabricated) on top of the sacrificial release layer, and the sacrificial release layer is then selectively removed (by etching) so that the system is either free-standing, floating or sufficiently de-adhered from the substrate, such that it can be separated from the substrate.

Fabrication processes according to various embodiments of the present invention involving such a sacrificial release layer may be used in the fabrication of stretchable electronic systems. The deformable electronics can be manufactured in a highly planar format, after which the deformable electronics may be separated from the original support substrate via removal of a sacrificial release layer (e.g., by an etch process). In some instances, the removal process involving the sacrificial release layer may be difficult to control and may lead to loss of the deformable electronics upon separation from the original support substrate (e.g., the deformable electronics may float away in an etchant and become twisted, tangled or broken as a result).

To mitigate the foregoing problems that may arise in some fabrication processes involving a sacrificial release layer, various embodiments of the invention disclosed herein relate generally to fabrication methods in which a loss of deformable electronics arising from separation of the deformable electronics from their original support substrate (e.g., by over etching) is significantly reduced or substantially prevented. In some embodiments, systems and devices fabricated using these inventive processes are also provided.

For example, according to one embodiment of an inventive fabrication process for deformable electronics involving a sacrificial release layer, a plurality of anchors is formed between an encapsulated electronic device array and a substrate. In one aspect, the anchors serve to adhere the encapsulated electronic device array to the substrate, and keep the encapsulated electronic device array substantially attached to the substrate when the sacrificial layer is removed. In another aspect, the encapsulated electronic device array can be separated from the substrate when a force is applied. In one example implementation, the force is applied using an elastomeric transfer stamp, as disclosed in U.S. Publication No. 20090199960 entitled "Pattern Transfer Printing by Kinetic Control of Adhesion to an Elastomeric Stamp" filed Jun. 9, 2006, which publication is hereby incorporated herein by reference it is entirety.

An example method for fabricating the flexible electronic structures can include applying a first layer to a portion of a substrate, removing selected portions of the first layer to provide a plurality of vias such that a portion of the vias extend substantially to a surface of the substrate, and disposing a second polymer layer, such that portions of the second polymer layer conform to a dimension of at least one of the plurality of vias and forms a plurality of anchors that contact at least a portion of the substrate. The second polymer layer is more resistant to a selective etchant than the first layer. The example method can further include disposing at least one electronic device layer above a portion of the first layer and/or the second polymer layer, forming at least one trench through the second polymer layer and the at least one electronic device layer to expose at least a portion of the first layer, exposing at least a portion of the first layer to the selective etchant through the at least one trench, and removing, by the selective etchant, portions of the first layer, thereby providing the flexible electronic structure. At least one anchor of the plurality of anchors can remains in contact with at least a portion of the substrate.

In an example, a method for fabricating the flexible electronic structure can further include applying a third polymer layer to at least a portion of the at least one electronic device layer; and forming at least one trench through the third polymer layer, the second polymer layer, and the at least one electronic device layer to expose at least a portion of the first layer.

In an example, the first layer can include polymethylmethacrylate, silicon dioxide, chromium, or titanium. In an example, the second polymer layer can include polyimide, polyethylene naphthalate, polybenzobisoxazole, benzocyclobutene, siloxane, or a liquid crystal polymer.

In an example, an average width of each of the plurality of vias can be in a range from about 10 µm to about 50 µm. In another example, an average width of each of the plurality of vias is in a range from about 0.1 µm to about 1000 µm.

In an example, respective ones of the plurality of vias can be spaced apart by an average separation ranging from about 50 µm to about 1,000 µm. In another example, respective ones of the plurality of vias are spaced apart by an average separation ranging from about 0.2 to about 10,000 µm. In yet another example, respective ones of the plurality of vias are spaced apart by an average separation ranging from about 200 to about 800 µm.

In an example, a method for fabricating the flexible electronic structures can include applying a first layer to a portion of a substrate, removing selected portions of the first layer to provide a plurality of vias such that a portion of the vias extend substantially to a surface of the substrate, and disposing a second polymer layer, such that portions of the second polymer layer conform to a dimension of at least one of the plurality of vias and forms a plurality of anchors that contact at least a portion of the substrate. The second polymer layer is more resistant to a selective etchant than the first layer. The example method can further include disposing at least one electronic device layer above a portion of the first layer and/or the second polymer layer, forming at least one trench through the second polymer layer and the at least one electronic device layer to expose at least a portion of the first layer, exposing at least a portion of the first layer to the selective etchant through the at least one trench, and removing, by the selective etchant, portions of the first layer, thereby providing the flexible electronic structure. At least one anchor of the plurality of anchors can remain in contact with at least a portion of the substrate. The example method can further include separating the flexible electronic structure from the substrate.

A flexible electronic structure fabricated according to one embodiment of an inventive fabrication process can include a second polymer layer having a first surface and a second surface, where the first surface includes a plurality of anchors, and at least one electronic device layer disposed above the second surface of the second polymer layer.

In another example, the flexible electronic structure can include a base polymer layer having a first surface and a second surface, where the first surface includes a plurality of anchors, and at least one electronic device layer disposed above a portion of the second surface of the base polymer.

In another example, the flexible electronic structure can include a base polymer layer having a first surface and a second surface, where the first surface includes a plurality of anchors, at least one electronic device layer disposed above a portion of the second surface of the base polymer, and a top polymer layer that is disposed above at least a portion of the at least one electronic device layer.

In another example, the flexible electronic structure can include a base polymer layer having a first surface and a second surface, where the first surface includes a plurality of anchors, and wherein at least one of the plurality of anchors contacts a substrate, and at least one electronic device layer disposed above a portion of the second surface of the base polymer.

In another example, the flexible electronic structure can include a base polymer layer having a first surface and a second surface, where the first surface includes a plurality of anchors, and wherein at least one of the plurality of anchors contacts a substrate, at least one electronic device layer disposed above a portion of the second surface of the base polymer, and a top polymer layer that is disposed above at least a portion of the at least one electronic device layer.

In another example, a flexible electronic structure disposed on a substrate is provided. The flexible electronic structure can include a first layer disposed on a portion of the substrate and a second polymer layer having a first surface and a second surface. The first surface can include a plurality of anchors. The plurality of anchors can extend through selected portions of the first layer and contact at least a portion of the substrate. The flexible electronic structure can further include at least one electronic device layer disposed above the second surface of the second polymer layer.

In another example, a flexible electronic structure disposed on a substrate can include a first layer disposed on a portion of the substrate, a second polymer layer having a first surface and a second surface, at least one electronic device layer disposed above the second surface of the second polymer layer, and a third polymer layer disposed above at least a portion of the at least one electronic device layer. The first surface of the second layer can include a plurality of anchors. The plurality of anchors extends through selected portions of the first layer and contact at least a portion of the substrate.

A flexible electronic structure disposed on a substrate and fabricated according to one embodiment of an inventive fabrication process herein can include a first layer disposed on a portion of the substrate, a second polymer layer having a first surface and a second surface, and at least one electronic device layer disposed above the second surface of the second polymer layer. The first surface of the second polymer can include a plurality of anchors, and the plurality of anchors can extend through selected portions of the first layer and contact at least a portion of the substrate. The plurality of anchors can have a diameter of about 50 µm and have a pitch ranging from about 200 µm to about 800 µm.

A flexible electronic structure fabricated according to one embodiment of an inventive fabrication process herein can include a base polymer layer having a first surface and a second surface and at least one electronic device layer disposed above the second surface of the base polymer layer. The first surface can include a plurality of anchors that have a diameter of about 50 µm and have a pitch ranging from about 200 µm to about 800 µm.

Any other applicable technique may be employed to fabricate a device according to the principles described herein. As non-limiting examples, the following patent publications (which are hereby incorporated herein by reference in their entireties, including drawings) describe applicable techniques that can be used, all or in part, in tandem with various inventive concepts disclosed herein, for device fabrication according to various embodiments of the present invention:

U.S. publication no. 2006 0038182-A1, published Feb. 23, 2006, filed Jun. 2, 2005, and entitled "STRETCHABLE SEMICONDUCTOR ELEMENTS AND STRETCHABLE ELECTRICAL CIRCUITS;"

U.S. publication no. 2008 0157234-A1, published Jul. 3, 2008, filed Sep. 6, 2006, and entitled "CONTROLLED BUCKLING STRUCTURES IN SEMICONDUCTOR INTERCONNECTS AND NANOMEMBRANES FOR STRETCHABLE ELECTRONICS;"

U.S. publication no. 2010 0002402-A1, published Jan. 7, 2010, filed Mar. 5, 2009, and entitled "STRETCHABLE AND FOLDABLE ELECTRONIC DEVICES;"

U.S. publication no. 2010 0087782-A1, published Apr. 8, 2010, filed Oct. 7, 2009, and entitled "CATHETER BALLOON HAVING STRETCHABLE INTEGRATED CIRCUITRY AND SENSOR ARRAY;"

U.S. publication no. 2010 0116526-A1, published May 13, 2010, filed Nov. 12, 2009, and entitled "EXTREMELY STRETCHABLE ELECTRONICS;"

U.S. publication no. 2010 0178722-A1, published Jul. 15, 2010, filed Jan. 12, 2010, and entitled "METHODS AND APPLICATIONS OF NON-PLANAR IMAGING ARRAYS;"

U.S. publication no. 2010 027119-A1, published Oct. 28, 2010, filed Nov. 24, 2009, and entitled "SYSTEMS, DEVICES, AND METHODS UTILIZING STRETCHABLE ELECTRONICS TO MEASURE TIRE OR ROAD SURFACE CONDITIONS;"

U.S. publication no. 2010-0298895, published Nov. 25, 2010, filed Dec. 11, 2009, and entitled "SYSTEMS, METHODS AND DEVICES USING STRETCHABLE OR FLEXIBLE ELECTRONICS FOR MEDICAL APPLICATIONS;" and PCT publication no. WO 2010/102310, published Sep. 10, 2010, filed Mar. 12, 2010, and entitled "SYSTEMS, METHODS, AND DEVICES HAVING STRETCHABLE INTEGRATED CIRCUITRY FOR SENSING AND DELIVERING THERAPY."

It should be appreciated that all combinations of the foregoing concepts and additional concepts described in greater detail below (provided such concepts are not mutually inconsistent) are contemplated as being part of the inventive subject matter described herein. All combinations of claimed subject matter appearing at the end of this disclosure are contemplated as being part of the inventive subject matter described herein. It should also be appreciated that terminology explicitly employed herein that also may appear in any disclosure incorporated by reference should be accorded a meaning most consistent with the particular concepts described herein.

BRIEF DESCRIPTION OF THE DRAWINGS

The skilled artisan will understand that the figures, described herein, are for illustration purposes only, and that the drawings are not intended to limit the scope of the described teachings in any way. In some instances, various aspects or features may be shown exaggerated or enlarged to facilitate an understanding of the inventive concepts described herein (the drawings are not necessarily to scale, emphasis instead being placed upon illustrating the principles of the teachings). In the drawings, like reference characters generally refer to like features, functionally similar and/or structurally similar elements throughout the various figures.

FIG. 1 shows a cross-sectional view of an example substrate used in an example method for manufacturing an electronic structure.

FIG. 2 shows a cross-sectional view of an example structure formed in an example process for manufacturing an electronic structure.

FIG. 3 shows a cross-sectional view of another example structure formed in an example process for manufacturing an electronic structure.

FIG. 4 shows cross-sectional and top views of another example structure formed in an example process for manufacturing an electronic structure.

FIG. 5 shows a cross-sectional view of another example structure formed in an example process for manufacturing an electronic structure.

FIG. 6 shows cross-sectional and top views of another example structure formed in an example process for manufacturing an electronic structure.

FIG. 7 shows a cross-sectional view of another example structure formed in an example process for manufacturing an electronic structure

FIG. 10 shows a cross-sectional view of an example electronic structure formed in an example process.

FIG. 11 shows a cross-sectional view of another example electronic structure formed in an example process.

DETAILED DESCRIPTION

Figure 8:
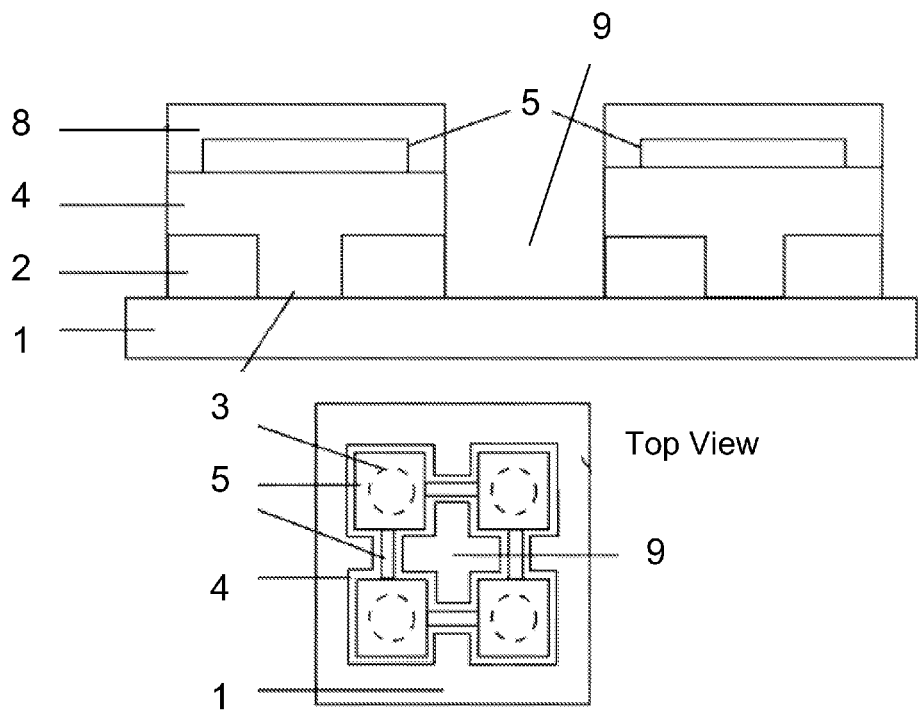
FIG. 8 shows cross-sectional and top views of another example structure formed in an example process for manufacturing an electronic structure

Following below are more detailed descriptions of various concepts related to, and examples of, electronic, optical and/or mechanical apparatus and systems, and methods for fabricating same involving sacrificial release layers and associated anchors. It should be appreciated that various concepts introduced above and described in greater detail below may be implemented in any of numerous ways, as the described concepts are not limited to any particular manner of implementation. Examples of specific implementations and applications are provided primarily for illustrative purposes.

As used herein, the term "includes" means includes but not limited to, the term "including" means including but not limited to. The term "based on" means based at least in part on.

With respect to description herein concerning the surface(s) of a substrate a layer, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom surface of a substrate" does not necessarily require that the indicated surface be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate and each other.

Provided herein are methods for selectively anchoring an array of electronic devices to a supporting substrate. In an example, a method includes providing a sacrificial layer on the supporting substrate, patterning trenches in the sacrificial layer, and providing a first encapsulating layer to support the array of electronic devices whereby the first encapsulating layer comes into contact with the supporting substrate via the trenches. An array of electronic devices is fabricated on the first encapsulating layer. The array of electronic devices are sealed with a second encapsulating layer. The sacrificial layer is removed by immersion in a suitable solvent. The encapsulated electronic devices can remain adhered to the support substrate due to forces of adhesion between the encapsulating layer and the support substrate.

In an example, the electronic structure is a flexible electronic structure.

FIG. 1 shows an example substrate that can be used to fabricate an example electronic structure. FIGS. 2 to 10 show example structures that are formed in the fabrication of the example electronic structure. In FIG. 2, a first layer 2 is applied to the substrate 1. In FIG. 3, selected portions of the first layer 2 are removed to provide a plurality of vias 6 that extend through the first polymer 2 layer substantially to the substrate 1. A second polymer layer 4 is applied to the first layer. As shown in the cross-sectional view of FIG. 4, in an example, portions of the second polymer layer 4 can be caused to conform to a dimension of a number of the vias 6 and to form anchors 3 that contact at least a portion of the substrate 1. In another example, a different polymer material can be caused to conform to a dimension of a number of the vias 6 and form the anchors 3, and the second polymer layer 4 is disposed above the first layer 2 interspersed with the anchors 5. As shown in the top view of FIG. 4, the anchors can be formed in a pattern.

As shown in the cross-sectional view of FIG. 5, at least one electronic device layer 5 is disposed on a portion of the second polymer layer. In a non-limiting example, the electronic device layer 5 may be subjected to further processing steps to fabricate differing types of electronic device components based on the at least one electronic device layer 5. For example, as shown in the cross-sectional view of FIG. 6, portions of the at least one electronic device layer 5 can be removed, e.g., by an etching process, to form electronic device components. As shown in the top view, portions of the at least one electronic device layer 5 may be positioned above the anchors 3. As shown in FIG. 7, a third polymer layer 8 is applied to at least a portion of the at least one electronic device layer 5. The second polymer layer 4 and the third polymer layer 8 are selected so that they are more resistant to a selective etchant than the first layer 2.

In an example, the third polymer layer is the top layer of the electronic structure.

In an example, the thickness of the third polymer layer (or, in an example, the top layer) is configured to cause the location of a resultant neutral mechanical plane of the electronic structure to correspond to strain-sensitive layers of the electronic structure. The neutral mechanical plane is a region of the electronic structure where a strain-sensitive layer can be isolated from stresses and strains applied to the electronic structure, e.g., from bending, rolling, or folding. For example, the thickness of the third polymer layer (or, in an example, the top layer) can be selected such that the at least one electronic device layer is located at or near a neutral mechanical plane of the electronic structure.

At least one trench 9 is formed through the third polymer layer 8 and the second polymer layer 4 to expose at least a portion of the first layer 2 (see cross-sectional view of FIG. 8). In an example, the least one trench 9 can be formed through sections of the structure that does not include portions of the electronic device layer 5. In another example, the at least one trench 9 may be formed through sections of the structure that include portions of the electronic device layer 5. For example, the at least one trench 9 can be formed through portions of the electronic device layer 5 that are not functional or structural components of the electronic device.

Figure 9:
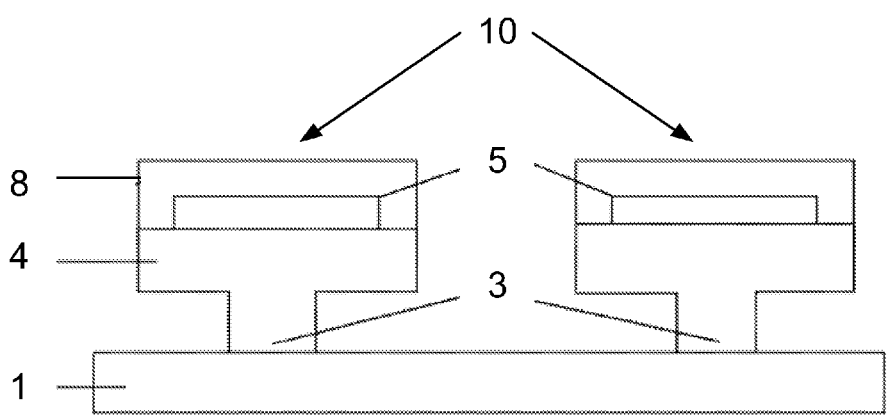
FIG. 9 shows a cross-sectional view of another example structure formed in an example process for manufacturing an electronic structure.

The structure of FIG. 8 can be exposed to the selective etchant to provide the structure of FIG. 9. As shown in FIG. 9, portions of the first layer that are exposed to the selective etchant through the trench 9 may be selectively removed by the selective etchant. The anchors 3 remain in contact with the substrate 1 after the etching using the selective etchant. FIG. 9 shows an example of an electronic structure 10 that can be formed according to the methods described herein. The electronic structure 10 can be a flexible electronic structure.

In an example, the flexible electronic structure can include an integrated circuit, a semiconductor, a transistor, a diode, a logic gate, arrays of electronic components, an optical system, a temperature sensors, a pressure sensor, electrical-conductivity sensors, electrodes for pH sensors, chemical sensors, sensors for enzymatic activity, resistors, capacitors, passive devices, light emitting diodes (LEDs), photodiodes (PDs), photodetectors, a battery, a transducer, an emitter, a receiver, or a transceiver.

In another example, the at least one electronic device layer includes at least one of a multifunctional sensor (including a temperature, strain, and/or electrophysiological sensor), a microscale light-emitting diode (LED), an active to passive circuit elements (including a transistor, a diode, a resistor, and/or a memristor), wireless power coils, and devices for radio frequency (RF) communications (including a high-frequency inductor, capacitor, oscillator, and/or antenna). The active elements of the at least one electronic device layer can include electronic materials such as silicon and gallium arsenide in the form of filamentary serpentine nanoribbons and micro- and nano-membranes. In an example, the at least one electronic device layer includes may be configured to provide solar cells and/or wireless coils to serve as a power supply.

The electronic structures herein, which can include interconnects, can exhibit ultrathin layouts, and employ neutral mechanical plane configurations and optimized geometrical designs.

In the example of FIG. 9, the electronic structure 10 is contacted with the substrate 1 via the anchors 3. In another example, the electronic structure 10 is separated from the substrate 1. As described in greater detail below, the electronic structure 10 may be removed using a removable medium.

In an example of the process, the electronic device layer 5 may be formed with multiple layers, including several layers and/or several portions of metal, electronic devices, polymers, semiconductor material, dielectric material, and any other material used for creating electronic devices. For example, as shown in FIGS. 10 and 11, a multiple layered electronic device layer 5a can be fabricated above the second polymer layer 4. The different layers of the electronic device layer 5a can be connected by conduits 7. The conduits 7 may be created using any applicable technique in the art, including an oxygen plasma etch. In an example, the oxygen plasma etch can be an oxygen reactive ion etch. The third polymer layer 8 can be applied to the electronic device layer 5a. For example, the third polymer layer 8 can be applied through spin coating. However, other techniques, including, e.g., spray coating, lamination, casting, or vapor deposition may be used to apply the third polymer layer.

As shown in FIGS. 10 and 11, a conduit 7 also can be formed in the third polymer layer 8. As described in connection with FIGS. 8 and 9, at least one trench can be formed in structures of FIGS. 10 and 11 to expose at least one portion of the first layer, and a selective etchant can be used to remove the remaining portions of the first layer, forming an electronic structure that is in contact with the substrate 1. The electronic structure may be removed using a removable medium.

In an example, the first polymer 2 is a sacrificial release layer. Removal of the sacrificial release facilitates the fabrication of the electronic structure. In an example, the electronic structure 10 is a stretchable electronic system. In the manufacture of a stretchable electronic system, deformable electronics can fabricated initially in a planar format and are released from the original substrate 1 by an etch process. This etch process can be difficult to control and may lead to loss of electronic arrays that may float away in the etchant, and become twisted, tangled or broken as a result. The processes, systems and devices described herein can prevent this loss of devices by preventing over etching. The anchors 3 can be created from portions of the second polymer layer 4 or can be formed from a different polymer material. The second polymer layer 4 can be an electric/electronic array encapsulation. The anchors 3 provide enough adhesion to keep the stretchable electronic system arrays attached to the support substrate 1 when the sacrificial layer is removed. The stretchable electronic system arrays may be readily separated from the support substrate 1 when an external force is applied (as a non-limiting example, a force applied by elastomeric transfer stamp as disclosed in United States Published Patent Application No. 20090199960 entitled "Pattern Transfer Printing by Kinetic Control of Adhesion to an Elastomeric Stamp" filed Jun. 9, 2006, which is incorporated herein by reference it is entirety).

In an example, vias 6 are patterned in the sacrificial layer 2 prior to fabrication of the electronic device layer 5. The vias 6 may begin at the surface of the sacrificial layer and end at the interface with the support substrate 1. The support substrate 1 may be a silicon wafer in an example. A non-limiting example of a suitable material to form a first layer, and in some examples, to serve as a sacrificial layer, is polymethylmethacrylate (PMMA). In another non-limiting example, the first layer is formed from silicon dioxide, chromium, or titanium. A non-limiting example of a suitable material to form a second polymer layer, and in some examples, to serve as an encapsulation layer, is polyimide. In another non-limiting example, the second polymer layer can be formed from polyethylene naphthalate, polybenzobisoxazole, benzocyclobutene, siloxane, or a liquid crystal polymer The Young's modulus of the substrate can be greater than that of the first layer (e.g., PMMA with a Young's modulus of 1800-3100 MPa) and the second polymer layer (e.g., polyimide with a Young's modulus of 2.5 GPa).

The PMMA can be selectively etched in acetone without affecting the polyimide. In a non-limiting example, the vias 6 (shown in FIG. 3) may be etched into the first layer of the PMMA by using an oxygen plasma etch through a stencil hardmask or a photolithographically patterned mask. Other applicable techniques in the art can be used to pattern the PMMA to form the vias 6. For example, direct exposure with a 220-250 nm wavelength laser light source through a mask followed by development (e.g., in a solvent). The vias 6 provide a path for the second polymer layer 4 material, e.g., the encapsulation layer material (including a polyimide) to come in contact with the support substrate 1, creating the anchors 6. The anchors 6 provide the anchoring force to retain the electronic structure substantially in contact with the substrate during the release step. In an example, the second polymer material (the encapsulation material) is spun-on. In another example, the second polymer material (the encapsulation material) may be deposited by spray coating or vapor deposition.

The vias or anchors may be in any two-dimensional geometry. As a non-limiting example, they can be formed as a circular cross-section, which may be easier to fabricate. Any other cross-sectional geometry of the vias or anchors is within the scope of this disclosure, such as but not limited to a hexagonal, oval or rectangular cross-section, or any polygonal or non-polygonal shape. In an example, the diameter of this circular cross-section can be between about 10 µm and about 50 µm. In an example, the width of the vias (or anchors) is selected such that the anchors provide sufficient adhesive force with the substrate to not separate during the etching of the first layer. In an example, the width of the vias (or anchors) also can be selected such that the anchors do not generate an adhesive force that prevents the array of electronics structure from being separated from the substrate, such as but not limited to in a transfer printing step, after the sacrificial release layer is removed. Although the range of the width of the vias or anchors can be between about 10 µm and about 50 µm, smaller diameters and larger diameters can be used. For example, the width of the vias or anchors can be selected based on the adhesive strength between the material of the anchor (such as but not limited to polyimide) and the substrate (such as but not limited to silicon). In an example, the width of the vias or anchors can range from about 0.1 μm to about 1000 μm.

The spacing of the vias or anchors also can be selected based on the intended adhesive strength between the anchors and the substrate. In an example, the number and spacing of vias or anchors can be determined based on the adhesive force to maintain the geometry of the array of electronic structures, and to substantially prevent distorting during the etching to remove the first layer (e.g., a sacrificial release layer). In an example, the number and spacing of vias or anchors is determined such that the total adhesive force of the anchors does not prevent separation of the array of electronic structures from the substrate, e.g., in a later transfer printing after the sacrificial etch. The exact pattern and placement of the vias or anchors can depend on the geometry of the array of electronic structures (including on the geometry of the array of electronic device layer 5). As a non-limiting example, the vias or anchors may be placed along the pattern of interconnected device islands. In an example, the vias or anchors can have a pitch between about 50 μm and about 1000 μm, i.e., they vias or anchors can be spaced apart by an average distance of between about 50 μm and about 1000 μm. In another example, the vias or anchors can be spaced apart by an average distance (a pitch) of between about 0.2 μm and about 10000 μm.

In a non-limiting example, the vias or anchors are cylindrical in shape, have a diameter of about 50 μm, and are spaced apart with spacing (a pitch) ranging from about 200 μm to about 800 μm. These anchors may be positioned along the pattern of interconnected device islands.

When a second polymer layer material is deposited onto the first layer, it can conform to the dimensions of the vias and contact the support substrate to form the anchor 3 (see, for example, FIG. 4). Any number of metal, semiconductor, dielectric, and device layers can be disposed above the second polymer layer of the second polymer layer using any applicable technique in the art. A third polymer layer 8 may be disposed above the electronic device layer 5. For example, the third polymer layer 8 may be an encapsulation layer that protects the electronic device layer 5 during a later etching process or other processing. In an example, the at least one electronic device layer 5 is formed a multiple electronic device layers. Each of the multiple electronic device layers can include electronic devices and electronic device components. One or more of the electronic device layers 5 can be encapsulated in a polymer material. In an example, conduits 7 may be formed, e.g., by etching, and used to create contact pads to the functional portions of at least one of the electronic device layers.

In an example, a mask may be deposited onto the topmost layer of the electronic structure before further processing. In an example, the mask is created using a photolithographic patterning and etching process. In an example, the mask is an oxide layer. The mask can be used to control the further processing. For example, the mask can be used to prevent over-etching of an encapsulant polymer region that is being used to protecting the electronic devices and interconnects of the at least one electronic device layer 5.

In an example, an adhesion-promoting layer can be included between the first layer and the substrate (e.g., when it is used as a sacrificial layer). For example, where the first layer is PMMA, adhesion-promoting layer can be included between the PMMA and the substrate to ensure adequate bonding of the PMMA to the substrate. In an example, the substrate is a Si support substrate. In the absence of an adhesion-promoting layer, the vias patterned into the PMMA may distort. For example, the width of the vias in the PMMA may expand by a factor of about 5 to about 10 when the second polymer layer material is subjected to further processing. The coefficient of thermal expansion of PMMA is higher than polyimide or silicon; therefore it may undergo greater dimensions or volume changes than the polyimide or the silicon with temperature. As a result, portions of the structure may delaminate from the silicon substrate. In a non-limiting example, where the second polymer layer is a polyimide encapsulation layer, and the vias are formed in PMMA, curing the polyimide (e.g., at greater than 140° C., and more typically about 200-250° C.) can cause the change in dimension of the resulting anchors as compared to the original width of the vias. As a result, the anchors may not be formed with the intended dimensions. In a non-limiting example, the adhesion-promoting layer can be formed from hexamethyldisilazane (HMDS).

In an example where the second layer is cured at a higher temperature than the first layer, precautions can be taken to avoid out gassing, which can induce roughness in the encapsulating layer. For example, polyimide, which can be used to form the second polymer layer, cures at 250° C., whereas PMMA (which can be used to form the first layer) may be cured at a lower temperature, e.g., at 180° C. To avoid out-gassing of the first layer if a curing is performed on the second polymer layer, the first layer first may be cured at the cure temperature of the second polymer layer to evolve the more volatile components that may evaporate at the higher temperature. As a result, little or no out-gassing can occur from the first layer. There is less disturbance of the second polymer layer, creating an advantageously smoother surface for the deposition and patterning of electronic materials in the at least one electronic device layer 5. In another example, a slow ramped baking (e.g., about 100° C. per hour) from room temperature to the cure temperature of the second polymer layer (e.g., 250° C. for polyimide) also can improve the uniformity of the second polymer layer.

After any encapsulation, patterning, and isolation steps are complete in the fabrication, the first layer can then be removed using a selective etchant. The selective etchant is selected such that the other polymer materials in the structure are more resistant to the selective etchant than the first layer. As non-limiting examples, the selective etchant can be a solvent, a mixture of solvents, a plasma technique, or any other applicable technique in the art that can be used to selectively remove the first layer. For example, where the first layer is formed from PMMA, hot acetone may be used as the selective etchant to effectively separate the electronic structure from the substrate. In an example where the first layer is a silicon dioxide, the selective etchant can include hydroflouric acid. In an example where the first layer is a chromium, the selective etchant can include cerric ammonium nitrate. In an example where the first layer is a titanium, the selective etchant can include hydroflouric acid or hydrochloric acid. During the process for removing the first layer, the anchors are configured to remain substantially undisturbed and effectively hold the array of electronic structures in place relative to one another and to the substrate.

In an example, the structures can be subjected to a longer process for removing the first layer. For example, the structures may be left in a release bath for a long time the array of electronic structures being separated from the substrate or losing registration with the substrate. This process of preparing flexible electronics structures, which in an example includes stretchable electronics structures, is suited for subsequent transfer printing using any applicable technique in the art.

Figure 12:
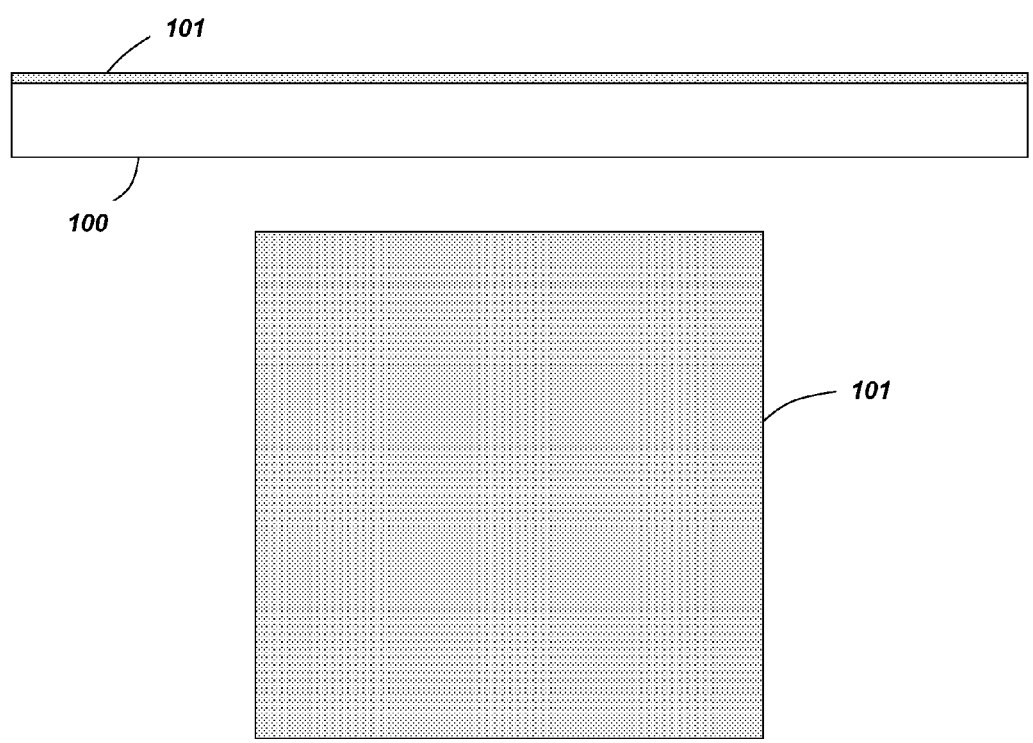
FIG. 12A-12L show cross-sectional views of an example process for manufacturing of an electronic structure.
Figure 12:
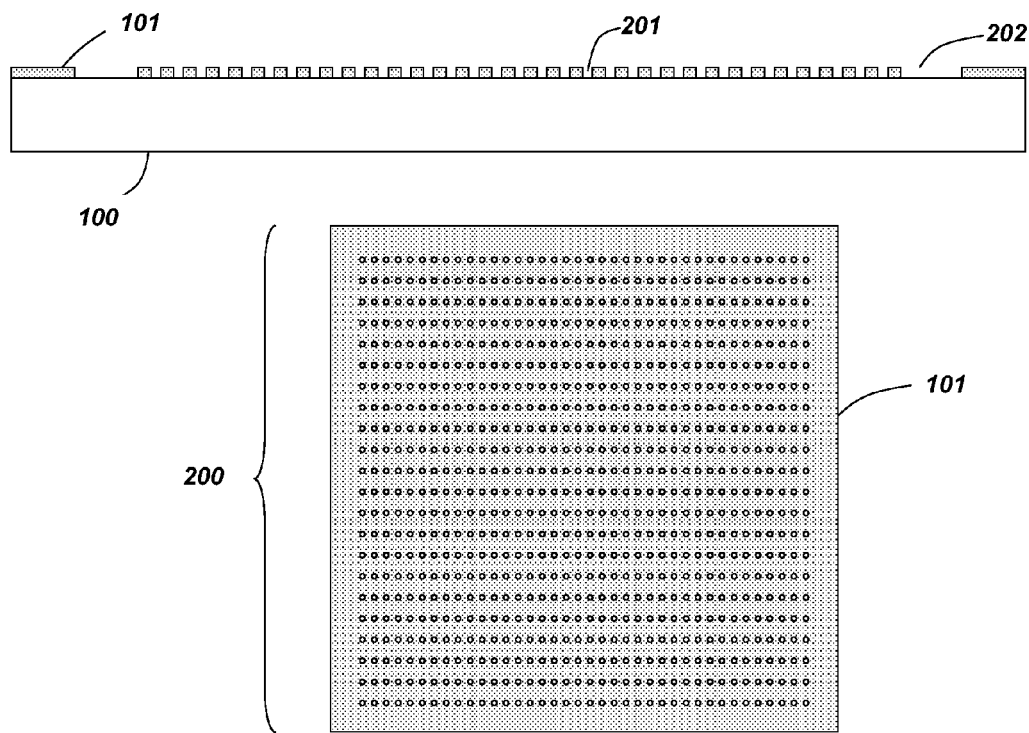
Figure 12:
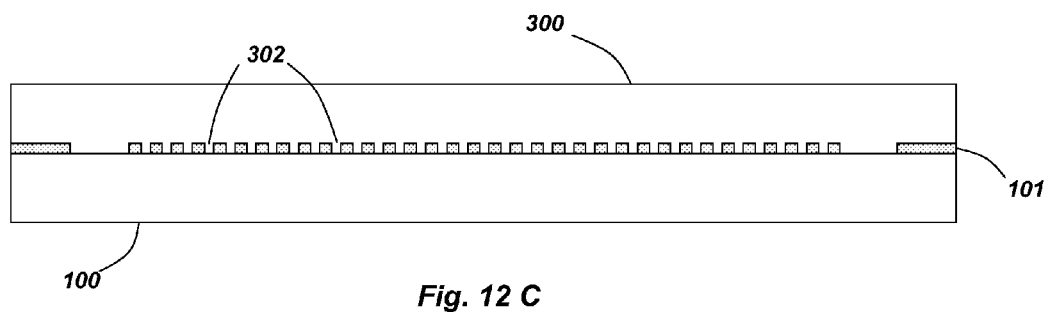
Figure 12:
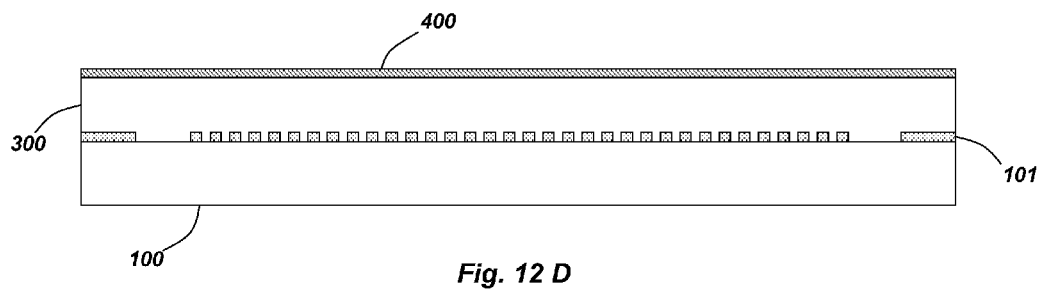
Figure 12:
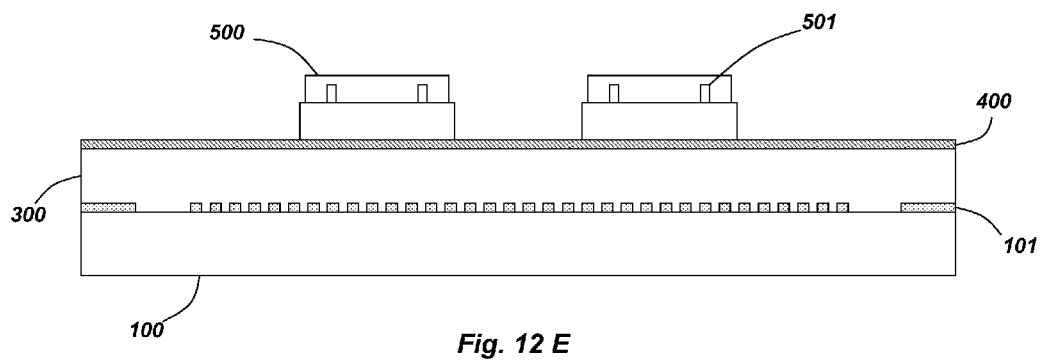
Figure 12:
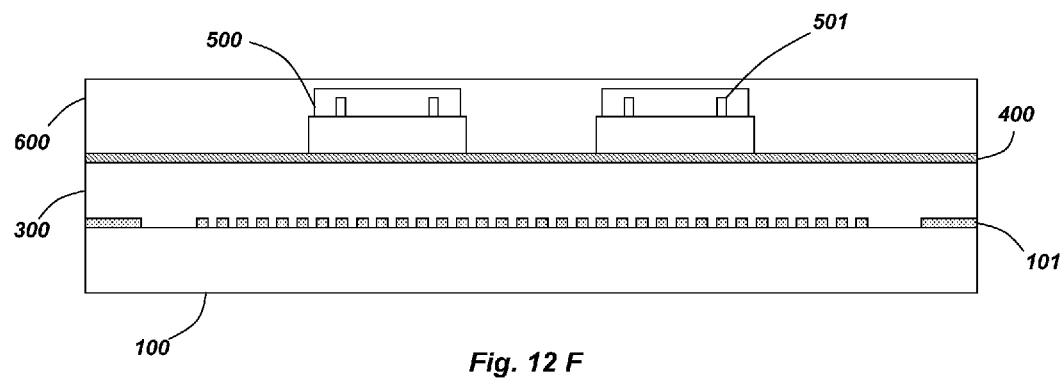
Figure 12:
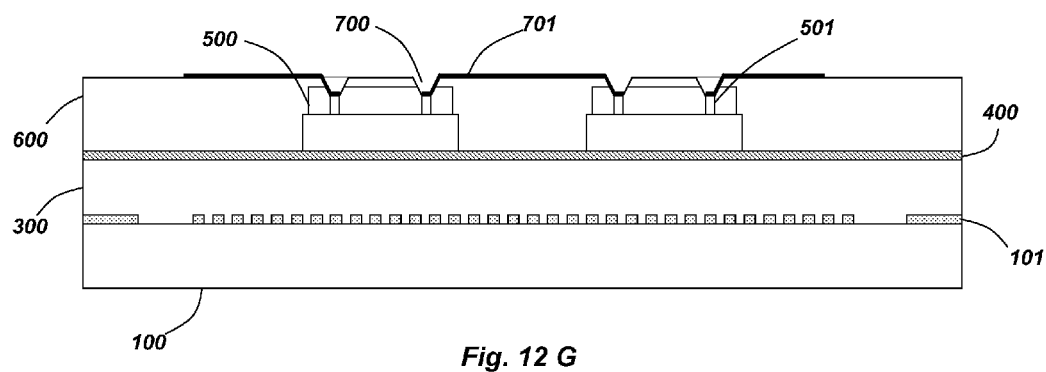
Figure 12:
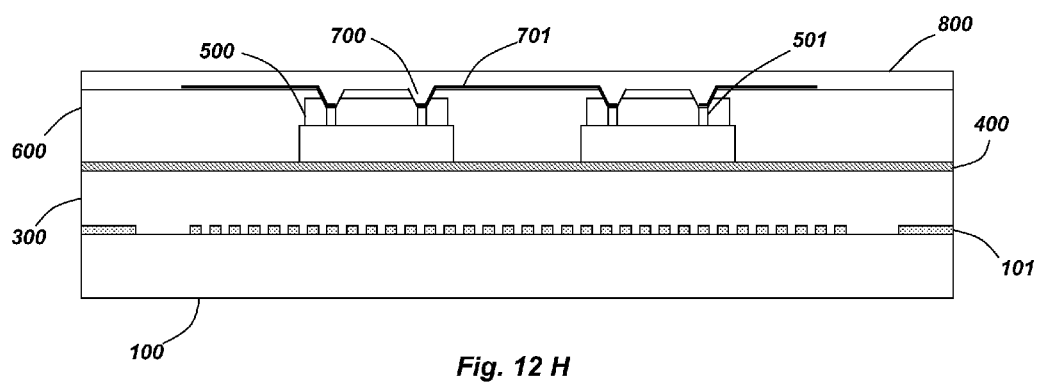
Figure 12:
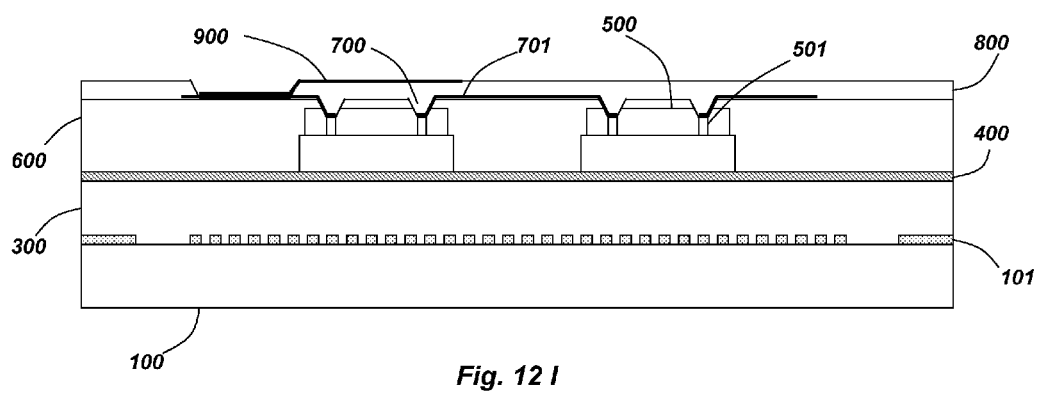
Figure 12:
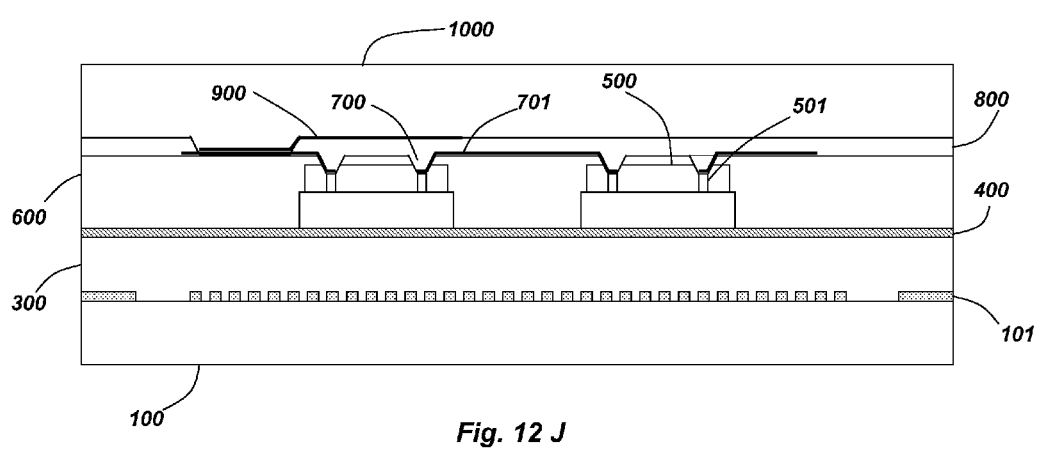
Figure 12:
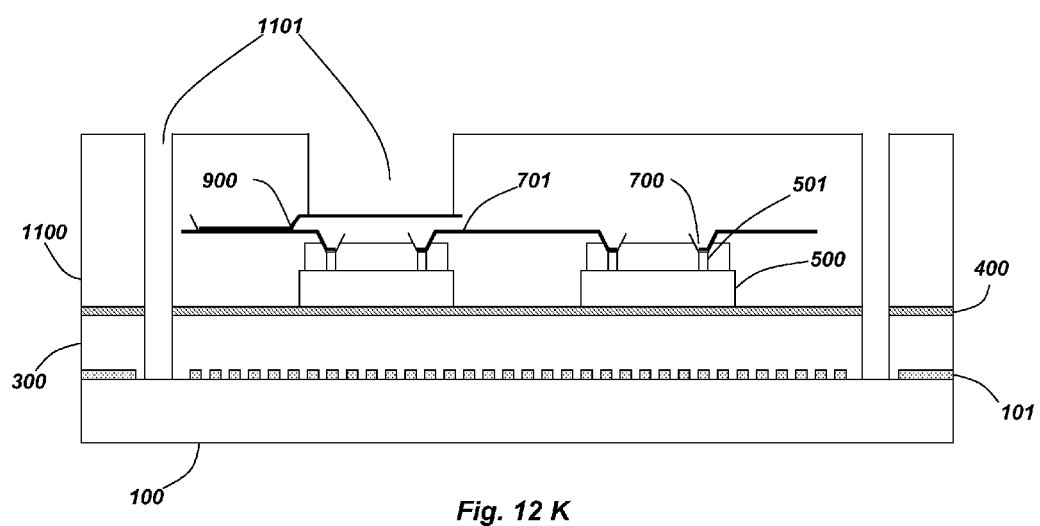
Figure 12:
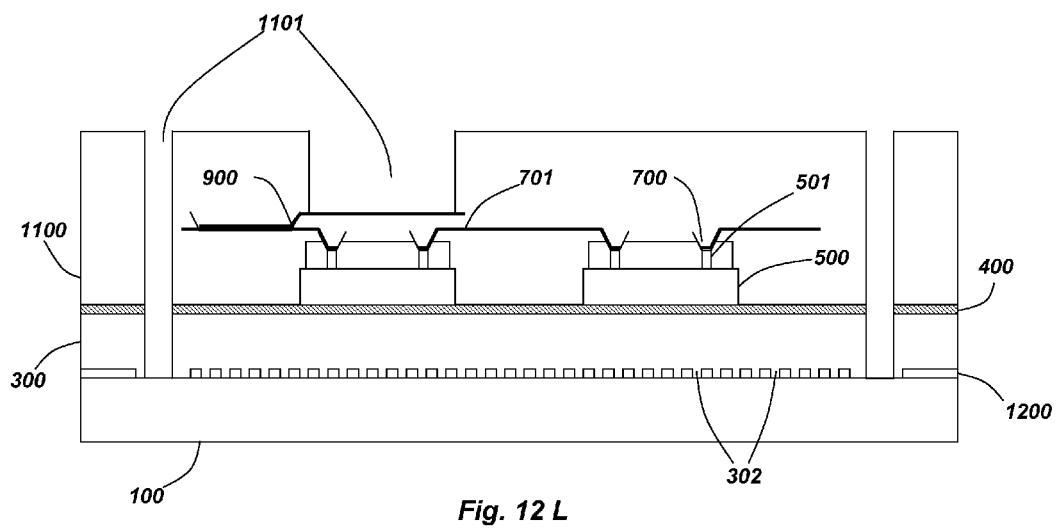

FIGS. 12A-12L show another non-limiting example process for fabricating an array of electronic structures on a substrate. In FIG. 12A, a first layer 101 is applied to a substrate 100. An example of the first layer can be a PMMA sacrificial layer. The first layer 101 can be patterned using any number of techniques in the art and depending on the type of material in the first layer. The patterning facilitates the selective removal of portions of the first layer to form the vias 201 (shown in FIG. 12 B). For an example where the first layer is formed from PMMA, the vias 201 may be formed in the PMMA using an oxygen plasma etch through a stencil hardmask or a photolithographically patterned mask. Other techniques in the art for selectively removing portions of the PMMA, including direct exposure to laser light of wavelength between 220-250 nm through a mask followed by development. In addition, other larger regions of the first layer may be selectively removed, such as feature 202 of FIG. 12B. According to an example, feature 202 is created to allow for test structures, manufacturing structures, piezoelectric structures, and/or lithography alignment marks to be created on the substrate. These features may not be transferred when performing the selective removal of the first layer. The vias 201 can extend substantially from a surface of the first layer to the substrate 100. The second polymer layer can be applied such that it substantially fills a number of the vias 201 and make contact with the substrate 100. As described above, the size (i.e., cross-sectional width) and density (based on the average spacing) of the vias can be varied to derive the desired degree of adhesion of formed anchors to the substrate. As also described above, the degree of adhesion can be selected such that the array of electronic structures maintain contact with the surface during removal of the first layer.

A second polymer layer (e.g., of an encapsulating polymer 300) can be applied to the structure. In an example, the second polymer material is applied to fill a number of the vias 201 and create anchors 302 (shown in FIG. 12C). In an example, the second polymer layer is applied through spin coating. However, other techniques, including, e.g., spray coating, lamination, casting, or vapor deposition may be used to apply the second polymer layer. The second polymer layer can be applied such that it conforms to a dimension of the vias, including filling the width and/or depth of the vias, to forming anchors 302 in contact with the substrate. At least one electronic device layer, including any number of metal, semiconductor, dielectric, and device layers, can be disposed on top of the second polymer layer. The topmost electronic device layer may be protected by a third polymer layer.

The vias 201 or anchors 302 may be in any two-dimensional geometry. For example, as shown in FIG. 12B, the vias 201 may be formed in a two-dimensional grid pattern. Other patterns of arrangement of the vias are applicable. The vias 201 or anchors 302 may be formed with a circular cross-section for easier fabrication, but any other cross-sectional geometry is within the scope of this disclosure. In an example, the diameter of the vias 201 or anchors 302 can be between about 10 μm and about 50 μm. In an example, the width of the vias 201 (or anchors 302) is selected such that the anchors 302 provide sufficient adhesive force with the substrate 100 to not separate during the etching of the first layer. In an example, the width of the vias 201 (or anchors 302) also can be selected such that the anchors 302 do not generate an adhesive force that prevents the array of electronics structures from being separated from the substrate after the sacrificial release layer is removed. The further processing can be, but not limited to, transfer printing step. In an example, the width of the vias 201 (or anchors 302) can be selected based on the adhesive strength between the material of the anchor 302 and the material of the substrate 100. In an example, the width of the vias 201 (or anchors 302) can range from about 0.1 μm to about 1000 μm.

The spacing of the vias 201 (or anchors 302) also can be selected based on the intended adhesive strength between the anchors 302 and the substrate 100. For example, the number and spacing of vias 201 (or anchors 302) can be selected to provide sufficient adhesive force to maintain the geometry of the array of electronic structures, and to substantially prevent distortion during removal of the first layer 101. In another example, the number and spacing of vias 201 (or anchors 302) is determined such that the total adhesive force of the anchors 302 does not impede separation of the array of electronic structures from the substrate 100. The pattern and placement of the vias 201 (or anchors 302) can depend on the geometry of the array of electronic structures. As a non-limiting example, the vias 201 (or anchors 302) may be placed along the pattern of interconnected device islands. In an example, the vias 201 (or anchors 302) may be spaced apart (i.e., have a pitch) by an average distance of between about 50 μm and about 1000 μm. In another example, the vias 201 (or anchors 302) may be spaced apart by an average distance of between about 0.2 μm and about 10000 μm.

In a non-limiting example, the vias 201 (or anchors 302) are cylindrical in shape, have a diameter of about 50 μm, and are spaced apart with spacing ranging from about 200 μm to about 800 μm.

As described above, an adhesion-promoting layer may be applied to ensure adequate bonding of the first layer 101 to the substrate 100. In an example where the first layer 101 is PMMA, the adhesion-promoting layer can be formed from a polymeric material. As a non-limiting example, the adhesion-promoting layer can be formed from hexamethyldisilazane (HMDS).

As described above, where the second polymer layer material 300 has a higher cure temperature than the first layer material 101, the first layer can be cured at the cure temperature of the second polymer layer material prior to application of the second polymer layer.

In an example, as shown in FIG. 12D, an adhesive layer 400 can be applied to prior to disposing the electronic device layer above the first layer and the second polymer layer. The adhesive layer may be formed from a dilute polyimide or a similar polymeric material. The adhesive layer 400 may be applied by a spin-coating or spray coating. Adhesive layer 400 assists in securing components of the at least one electronic device layer. For example, adhesive layer 400 assists in securing components 500. Once components 500 have been positioned on the adhesive layer 400, the structure may be cured to set the placement of the components 500.

In a non-limiting example, the at least one electronic device layer can include a metal, a semiconductor, a dielectric, a micro electro mechanical system (MEMS) component, and any other device component. FIGS. 12E to 12J show cross-sectional views of the structure as different electronic device layers are disposed on the structure. The electronic device layers include device islands 500 (with electronic component 501), interconnects 701, and contacts 900. As illustrated in FIGS. 12F and 12H, layers 600 and 800 of an encapsulant material, e.g., a polymer layer or an oxide layer, may be applied in regions of the electronic device layer prior to disposing another component of the layer. Layers 600 and 800 also may be used to planarize portions of the electronic device layer prior to addition of other components of the electronic device layer.

An oxide or polymer layer, such as layer 600 or layer 800, can be deposited prior to photolithographic patterning and etching, or other processing. The oxide or polymer layer helps to control the etch process and prevents over etching of the encapsulating regions of the electronic device layer, thus protecting the electronic devices and interconnects that are part of the electronic device layer.

As illustrated in FIGS. 12F and 12H, specific portions of the polymer can be removed to allow for fabrication of device interconnects. For example, using an etching technique, such as oxygen plasma etching, electrical vias 700 can be created in polymer layer 800. These electrical vias 700 can be used to expose a bare conductive pad 501 of a component. Once the conductive pads 501 are exposed, the interconnects 701 can be deposited using any applicable technique in the art, including physical vapor deposition, lithography, etching, plating, and direct platting. FIGS. 12H to 121 show the multilevel interconnects that can be created in an electronic device layer by applying additional layers of polymer 800, creating electrical vias 700, and then depositing electrical interconnects 701. The process of applying additional layers of electrical interconnects may be repeated as many times as needed to fully interconnect the components of the at least one electronic device layers.

As shown in FIG. 12 J, an additional layer, polymer layer 1000, may be applied. In this example, polymer layer 1000 can be the third polymer layer. Polymer layer 1000 can serve to encapsulate the at least one electronic device layers.

As shown in FIG. 12 K, trenches 1101 can be created in polymer layer 1000 to provide access to the contact pads and facilitate segmentation. For example, trenches 1101 may be created by lithography and etching, using laser ablation, by mechanical cutting or using pure photopatterning. In another example, trenches 1101 could be created by photodefining one or more layers as the system is additively manufactured. The segmentation process, creating trenches 1101, allows for direct access of the selective etchant to the first layer 101. The etching time to remove the first layer may be greatly reduced by creating multiple access holes (including other trenches) throughout the device.

Once chemical access to the first layer is created, the selective etchant can act to remove remaining portions of the first layer. This results in cavities 1200 being formed beneath the electronic structure and exposing the anchors 302 (see FIG. 12L). The selective etchant removes much of the remaining portions of the first layer without harming the materials exposed in the electronic structure. In an example where the first layer is formed from PMMA, hot acetone can be used as the selective etchant to effectively separate the electronic structure (i.e., the encapsulated devices) from the substrate. During this process, the anchors 302 remain substantially undisturbed and effectively maintain the encapsulated electronic devices in substantially the same position relative to each other and to the substrate.

Transfer printing may be performed using any applicable technique in the art to separate the electronic structure described herein from the substrate after removal of the remaining portions of the first layer. In an example, the transfer printing can be performed using a removable medium, including an elastomeric stamp or cylinder, a selectively adhesive tape, or a tape that can be removed, after transfer, with an oxygen plasma etch, UV light, application of heat, or dissolving in a solvent or mixture of solvents (including water). In an example, regions of the electronic structure where large bulk areas of the polymer layer are in contact with the substrate may not be removed during a transfer process.

In an example, the transfer printing can be performed to transfer the arrays of the electronic structures from one substrate to another, e.g, from a carrier substrate to a final device substrate. For example, the arrays of the electronic structures may be fabricated on a rigid substrate and then transferred using transfer printing to a soft, flexible, and or stretchable substrate (including polydimethylsiloxane (PDMS,), ECOFLEX® (BASF Chemical Company, Florham Park, N.J.), or any other elastomer, rubber, plastic, fabric or polymer material). The transfer process may introduce additional defects (including breakage and incomplete transfer), resulting in low yield. The operation can be sensitive to differences in the adhesive forces between the array-to-stamp interface and the anchor-to-substrate interface. They may be difficult to accurately and consistently control. In addition, transferring the array from the stamp to the second (stretchable) substrate may require that the adhesive forces for the array-to-second substrate contact are greater than the forces at the array-to-stamp contact. The stamp-to-second substrate adhesive forces can be small enough to remove the stamp without damaging the second substrate. Covalent bonding forces may be used between a silicon dioxide layer on the array and an oxygen-terminated surface of the second (stretchable) substrate to obtain a strong bond for device mechanical durability. This process can result in the stamp becoming too strongly bonded to the second (stretchable) substrate, and as a result, removing the stamp can damage the array.

A removable medium can be used to separate the array of electronic structure from the support substrate. The removable medium can present a large adhesion force. For example, the removable medium to array adhesive forces can be greater than the pattern to substrate forces. Therefore, the removable medium can be used to separate the array from the substrate. In addition, where the removable medium is a water-dissolvable medium, it can be dissolved in water. Therefore, the second transfer process (i.e., from removable medium to ECOFLEX® substrate may not depend on any difference in forces whatsoever. In addition, if a strong bond (i.e., oxygen bonding as described above) is used for the second transfer process, the removable medium is removed easily and substantially without residue, using only water regardless of the strength of the removable medium to second substrate bond strength.

In a non-limiting example, the arrays of the electronic structures may be removed from the substrate using a removable medium. In an example, the removable medium may be a selectively adhesive tape, a tape that can be removed by exposure to UV light, with application of heat, using an oxygen plasma etch, or by dissolving in a solvent or mixture of solvents (including water). In an example, the removable medium may be an elastomeric stamp or cylinder. In an example, the removable medium is a water-dissolvable tape.

In an example, the electronic structures are separated from the substrate by applying a removable medium on a portion of the top layer of the electronic structure, and applying a force to the removable medium to separate the anchors of the electronic structure from the substrate. The removable medium can be selected such that its adhesion strength to the top layer of the electronic structure is greater than the adhesion strength of the anchors to the substrate.

Figure 13:
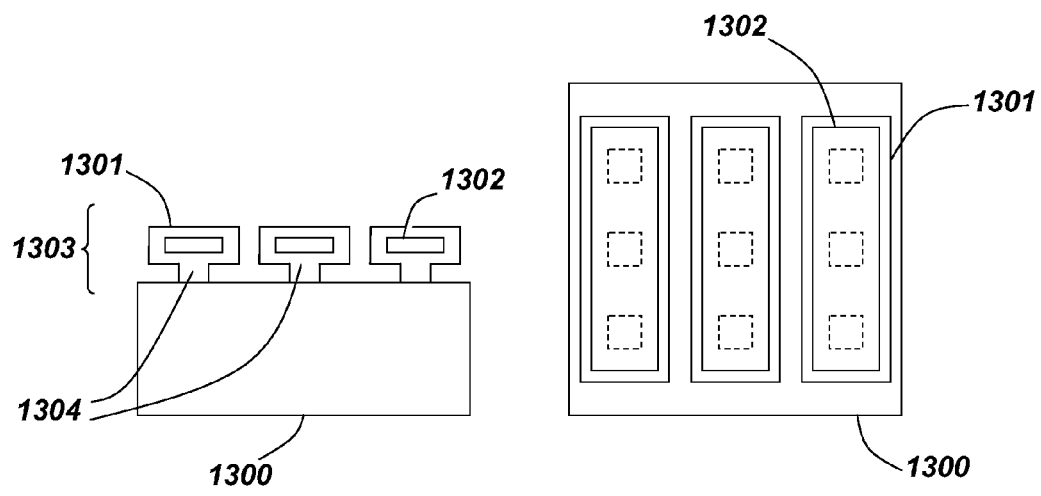
FIG. 13 shows an example substrate with a fabricated array of electronic structures.
Figure 14:
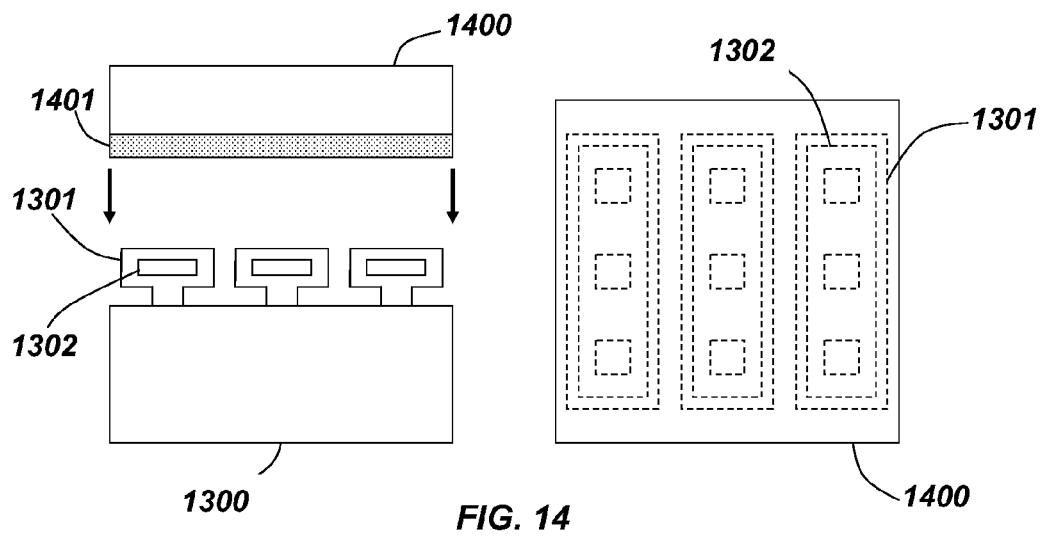
FIG. 14 shows an example of the application of a removable medium to a substrate with a fabricated array of electronic structures.
Figure 15:
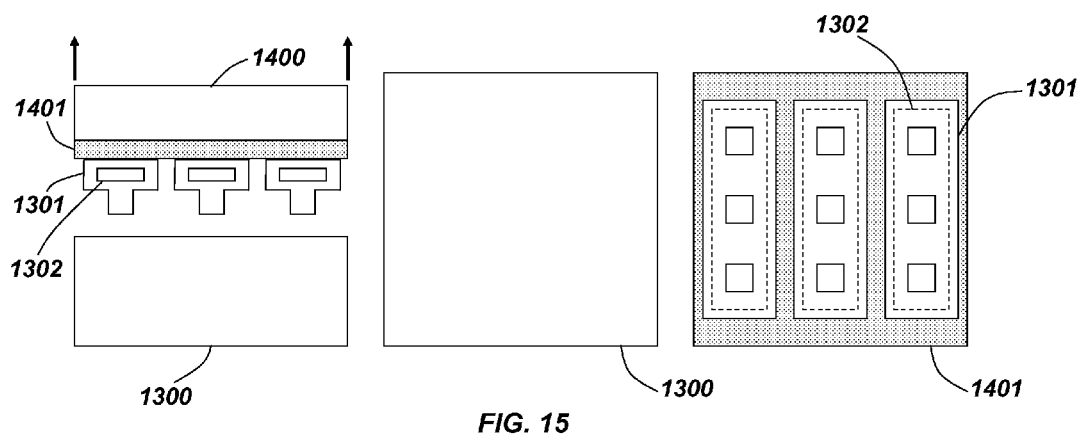
FIG. 15 shows an example of the removal of an array of electronic structures from a substrate using a removable medium.

FIGS. 13-20 show non-limiting examples of the use of a removable medium. FIG. 13 shows an array of electronic structures 1303 that are formed according to a principle herein. Anchors 1304 of an array of the electronic structures 1303 maintains contact with a substrate 1200. The array of the electronic structures 1303 can include electronic device layers 1302 encapsulated in a polymer 1301. In this example, a removable medium 1400 with an adhesive layer 1401 is applied to the arrays of the electronic structures (as shown in FIG. 14). After securing the removable medium 1400 to the array of electronic structures 1400, force is applied to the removable medium to detach the array of electronic structures from the substrate (as shown in FIG. 15).

A removable medium 1400 can be selected based on its adhesion characteristics for a specific layer material. For example, removable medium 1400 can be selected based on its adhesion characteristics such that the removable medium to electronic structure adhesion force is greater than the anchors to substrate force. The arrays of electronic structures 1303 may be removed from the substrate, and remain contacted with the removable medium 1400, without causing defects in the electronic devices of the electronic structure or causing breakage.

Figure 16:
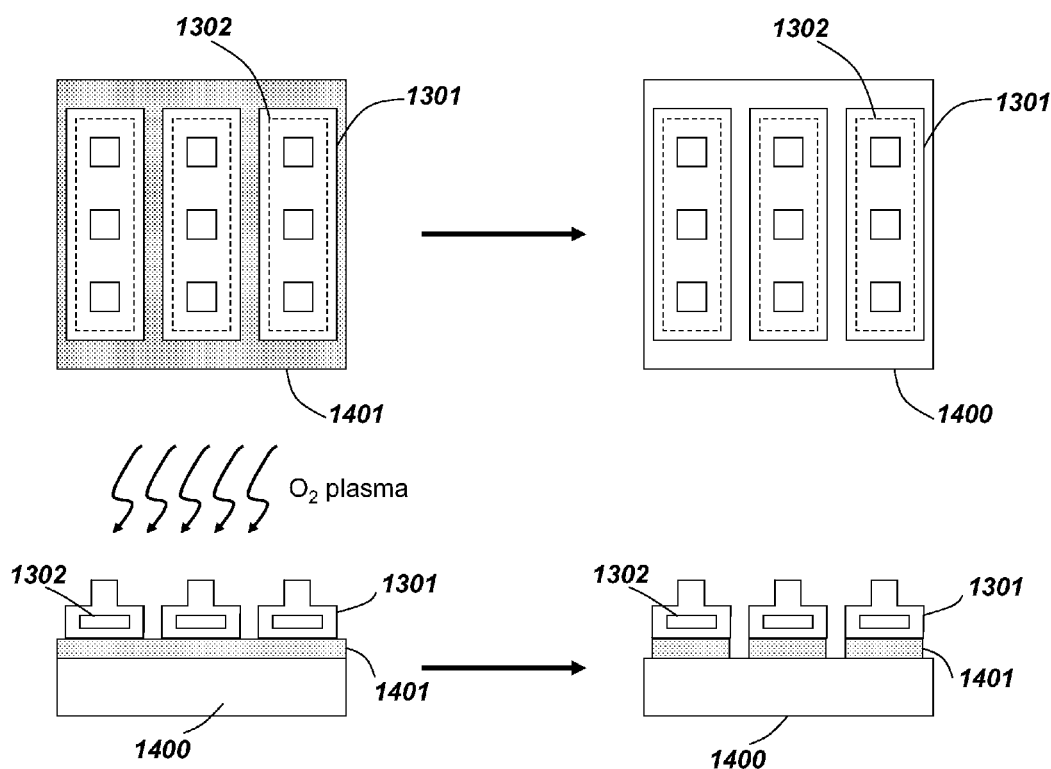
FIG. 16 shows an example of the exposure of a removable medium to an oxygen plasma.

As shown in FIG. 16, the removable medium 1400 and the electronic structures 1303 can be exposed to an oxygen plasma to remove the portions of the adhesive layer 1401 from the areas not covered by the arrays of the electronic structures 1303. In an example, the oxygen plasma can be applied at a 40-sccm oxygen flow rate, with 100-W rf power, and a 30-sec treatment. As shown in the cross-sectional view of FIG. 16, the oxygen plasma removes the portions of the adhesive layer 1401 that are not contacting the electronic structure 1303.

Figure 17:
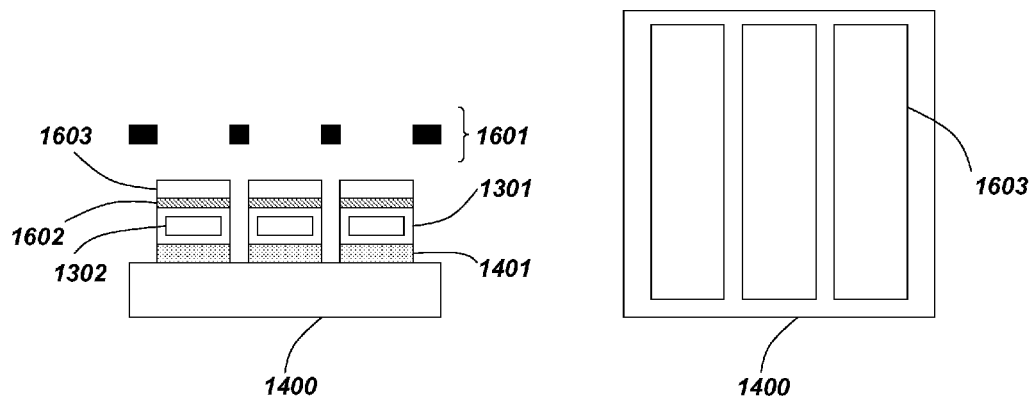
FIG. 17 shows an example of the deposition of a metal followed by an oxide using a shadow mask.

As shown in FIG. 17, a metal layer and/or an oxide layer may be deposited on the electronic structure. In an example, the metal layer is a 3-nm Titanium layer, and the oxide layer is a 30-nm $SiO_2$ layer. The metal layer and/or oxide layer can be evaporated onto the surface of the arrays of the electronic structures 1303 that is away from the removable medium 1400. In an example, a shadow mask 1601 is used to confine the evaporation to solely the arrays of the electronic structures.

Figure 18:
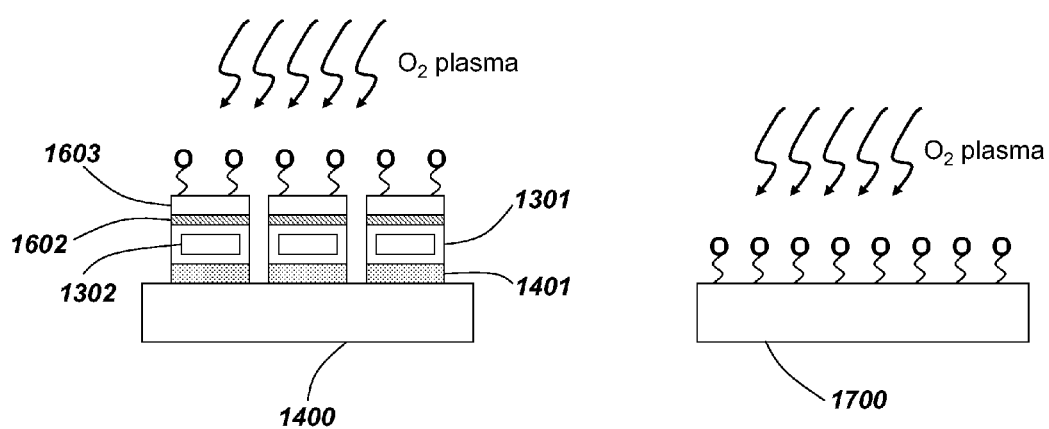
FIG. 18 shows an example process for exposing an array of electronic structures, a medium, and a second substrate to an oxygen plasma.

In FIG. 18, the removable medium 1400, arrays of the electronic structures 1303, and a second substrate 1700 are exposed to an oxygen plasma to create highly oxygen-terminated surfaces. In an example, the oxygen plasma is applied at a 40-sccm oxygen flow rate, and using 100-W rf power, for a 30-sec treatment. In some examples, the second substrate 1700 may be a flexible material or a stretchable material. For example, the second substrate 1700 can be a polymer, including but not limited to ECOFLEX®.

Figure 19:
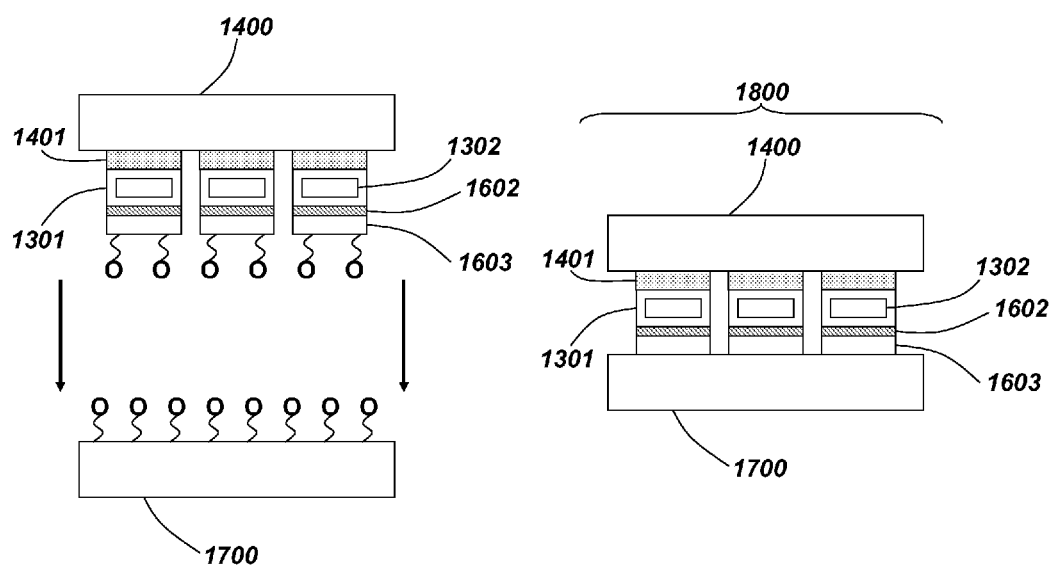
FIG. 19 shows an example application of a removable medium and an array of electronic structures to a second substrate.

In FIG. 19, the highly oxygen-terminated surface of the second surface is contacted with the highly oxygen-terminated surface of the electronic structure, to provide a component 1800. In an example, a pressure is applied to ensure contact between second substrate 1700 and the electronic structures 1303.

Figure 20:
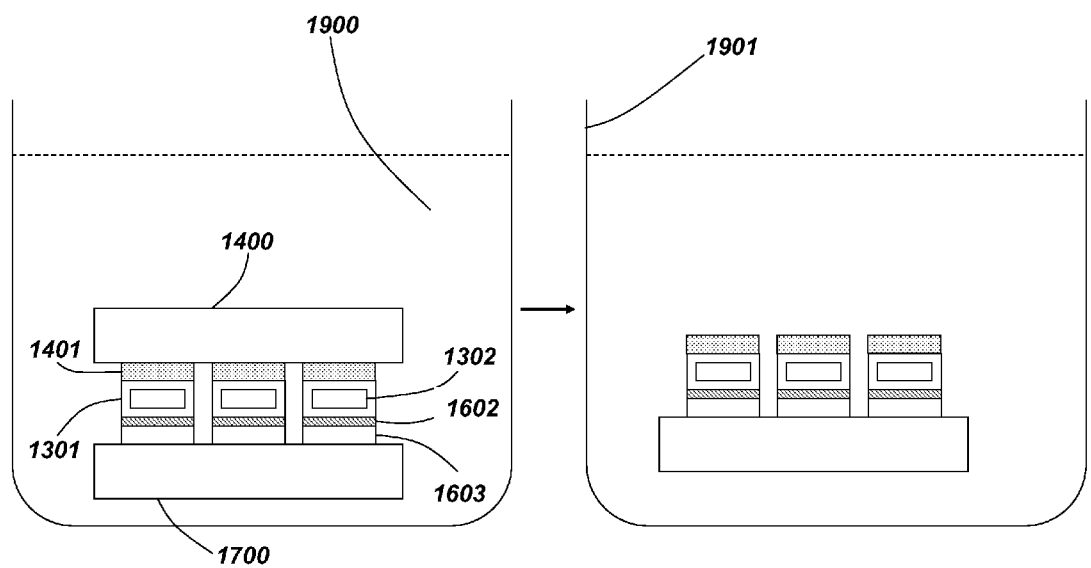
FIG. 20 shows an example of the removal of a removable medium from an array of electronic structures.

FIG. 20 shows an example of the removal of the removable medium 1400. In an example, the removable medium 1400 is a water-dissolvable tape. The arrays of the electronic structures 1303, the removable medium 1400, and the second substrate are placed in a containment vessel 901 with 100° C. water 900 for 30 minutes. In this embodiment, exposure of the removable medium to water dissolves the removable medium and removes any residue left on the arrays of the electronic structures.

EXAMPLE IMPLEMENTATION

A non-limiting example of a process for fabricating an electronic structure that is contacted to a substrate using anchors is as follows:

1 RCA clean silicon wafer
2 Spin coat PMMA sacrificial layer coating (~100 nm)
3 Cure PMMA at 250° C.
4 Pattern PMMA
5 Spin coat PI to create posts in PMMA vias (~10 μm)
6 Cure PI at 250° C.
7 Deposit Cr/Au (~100 Å/5000 Å)
8 Spin coat photoresist (PR)
9 Soft bake PR
10 Expose PR using patterned mask of metal design
11 Develop PR
12 Rinse wafers
13 Etch gold in potassium iodide
14 Etch chromium in cerric ammonium nitrate
15 Rinse wafers in De-ionised Water (DIW)
16 Strip PR
17 Spin coat PI to encapsulate gold pattern (~10 μm)
18 Cure PI at 250° C.
19 Deposit $SiO_2$ hard mask layer (50-100 nm)
20 Spin PR
21 Softbake PR
22 Expose PR using patterned mask of PI encapsulation design
23 Develop PR
24 Rinse wafers in DIW
25 Etch SiO2 layer/PI exposed by PR pattern in $CF_4/O_2$ Reactive Ion Etch (RIE) respectively
26 Etch PMMA layer using hot acetone bath
27 Remove encapsulated metal from Si support by suitable transfer printing methods (e.g., Soft Lithography or tape)

Another non-limiting example of a process fabricate an electronic structure that is contacted to a substrate using anchors is as follows:

1 Clean rigid carrier substrate
2 Apply sacrificial layer material
3 Anneal sacrificial layer @T1 (where T1 is a cure temperature for a material in the electronic structure)
4 Pattern sacrificial layer to create vias to the substrate
5 Apply base layer polymer to create posts in sacrificial layer vias
6 Cure polymer layer @T1 or lower
7 Electronic processing (varying levels of complexity)
  Embedding active devices
  Multiple layers of interconnects
8 Apply top layer polymer to encapsulate electronics
9 Cure polymer layer @T1 or lower
10 Deposit masking material
11 Pattern masking material
12 Etch trenches to define device geometry and access sacrificial layer
13 Etch sacrificial layer using selective etchant that won't attack any of the device elements
14 Remove encapsulated electronic system from carrier substrate support by suitable transfer printing methods (e.g., soft Lithography or tape)

Any other applicable technique may be employed to fabricate a device according to the principles described herein.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology described above. The computer readable medium or media can be transportable, such that the program or programs stored thereon can be loaded onto one or more different computers or other processors to implement various aspects of the present technology as described above.

The terms "program" or "software" are used herein in a generic sense to refer to any type of computer code or set of computer-executable instructions that can be employed to program a computer or other processor to implement various aspects of the present technology as described above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method for fabricating a flexible electronic structure, said method comprising:
    applying a first layer to a portion of a substrate;
    removing selected portions of the first layer to provide a plurality of vias, wherein a portion of the vias extend substantially to a surface of the substrate;
    disposing a second polymer layer, such that portions of the second polymer layer conform to a dimension of at least one of the plurality of vias and forms a plurality of anchors that contact at least a portion of the substrate, wherein the second polymer layer is more resistant to a selective etchant than the first layer;
    disposing at least one electronic device layer above a portion of the first layer and/or the second polymer layer;
    applying an adhesive layer to a portion of the second polymer layer prior to disposing the at least one electronic device layer;
    forming at least one trench through the second polymer layer and the at least one electronic device layer to expose at least a portion of the first layer;
    exposing at least a portion of the first layer to the selective etchant through the at least one trench; and
    removing, by the selective etchant, portions of the first layer, thereby providing the flexible electronic structure, wherein at least one anchor of the plurality of anchors remains in contact with at least a portion of the substrate.

2. The method of claim 1, wherein an average width of the vias is selected such that at least some of the plurality of anchors resist the selective etchant to remain substantially in contact with at least a portion of the substrate.

3. The method of claim 1, further comprising:
    applying a removable medium to a portion of the at least one electronic device layer; and
    applying a force to separate the flexible electronic structure from the substrate;
    wherein the removable medium is selected such that the adhesion strength of the removable medium to the at least one electronic device layer is greater than the adhesion strength of the anchors to the substrate.

4. The method of claim 1, wherein an average width of the plurality of anchors is in a range from about 10 µm to about 50 µm.

5. The method of claim 1, wherein an average width of the plurality of anchors is in a range from about 0.1 µm to about 1000 µm.

6. The method of claim 1, wherein at least some of the plurality of anchors have a substantially circular cross-section.

7. The method of claim 1, wherein at least some of the plurality of anchors have a substantially hexagonal cross-section, a substantially oval cross-section, a substantially rectangular cross-section, a polygonal cross-section, or a non-polygonal cross-section.

8. The method of claim 1, wherein the plurality of anchors are formed in a two-dimensional array.

9. The method of claim 1, wherein an average width of each of the plurality of vias is in a range from about 10 µm to about 50 µm.

10. The method of claim 1, wherein an average width of each of the plurality of vias is in a range from about 0.1 µm to about 1000 µm.

11. The method of claim 1, wherein respective ones of the plurality of vias are spaced apart by an average separation ranging from about 50 µm to about 1,000 µm.

12. The method of claim 1, wherein respective ones of the plurality of vias are spaced apart by an average separation ranging from about 0.2 µm to about 10,000 µm.

13. The method of claim 1, wherein respective ones of the plurality of vias are spaced apart by an average separation ranging from about 200 µm to about 800 µm.

14. The method of claim 1, wherein the first layer comprises polymethylmethacrylate, silicon dioxide, chromium, or titanium.

15. The method of claim 1, wherein the second polymer layer comprises polyimide, polyethylene naphthalate, polybenzobisoxazole, benzocyclobutene, siloxane, or a liquid crystal polymer.

16. The method of claim 1, wherein the first layer comprises polymethylmethacrylate and the selective etchant comprises acetone.

17. The method of claim 1, wherein the first layer comprises silicon dioxide and the selective etchant comprises hydroflouric acid.

18. The method of claim 1, wherein the first layer comprises chromium and the selective etchant comprises cerric ammonium nitrate.

19. The method of claim 1, wherein the first layer comprises titanium and the selective etchant comprises hydroflouric acid or hydrochloric acid.

20. The method of claim 1, wherein the substrate comprises at least one of a test structure, a manufacturing alignment structure, a piezoelectric structure, and a lithography alignment mark.

21. The method of claim 1, wherein the adhesive is a polyimide or other polymer.

22. The method of claim 1, further comprising curing the adhesive layer prior to disposing the at least one electronic device layer.

23. The method of claim 1, wherein the at least one electronic device layer comprises at least one of a metal, a semiconductor, and a dielectric.

24. The method of claim 1, further comprising curing the first layer at a cure temperature of the second polymer layer prior to applying the second polymer layer, wherein the cure temperature of the second polymer layer is higher than a cure temperature of the first layer.

25. The method of claim 1, further comprising patterning a mask on the at least one electronic device layer prior to forming the at least one trench, wherein the mask forms a pattern of the at least one trench.

26. The method of claim 1, further comprising removing selected portions of the first layer using an oxygen plasma etch.

27. The method of claim 1, wherein the at least one trench is formed by using lithography and etching, using laser ablation, by mechanical cutting or using pure photopatterning.

28. The method of claim 1, further comprising:
applying a third polymer layer to at least a portion of the at least one electronic device layer; and
forming the at least one trench through the third polymer layer, the second polymer layer, and the at least one electronic device layer to expose at least a portion of the first layer.

29. The method of claim 28, wherein the third polymer layer is applied using a spin coating process, spray coating, lamination, casting, or vapor deposition.

30. The method of claim 28, wherein a thickness of the third polymer layer is configured such that the at least one electronic device layer is at a neutral mechanical plane of the electronic structure.

31. The method of claim 1, further comprising:
applying a removable medium to a portion of the at least one electronic device layer; and
applying a force to separate the flexible electronic structure from the substrate.

32. The method of claim 31, further comprising removing the removable medium using selective removal process.

33. The method of claim 32, wherein the selective removal process is exposure to a solvent, heating, exposure to UV light, or an oxygen plasma etch.

34. The method of claim 1, wherein the substrate is a rigid substrate.

35. The method of claim 1, wherein the substrate has a higher Young's modulus than the second polymer layer.

36. A flexible electronic structure comprising:
a second polymer layer having a first surface and a second surface, wherein the first surface comprises a plurality of anchors; and
at least one electronic device layer disposed above the second surface of the second polymer layer,
wherein the electronic structure is fabricated according to the method of claim 1.

37. A method for fabricating a flexible electronic structure, said method comprising:
applying a first layer to a portion of a substrate;
removing selected portions of the first layer to provide a plurality of vias, wherein a portion of the vias extend substantially to a surface of the substrate;
disposing a second polymer layer, such that portions of the second polymer layer conform to a dimension of a number of the vias and forms anchors that contact at least a portion of the substrate, wherein the second polymer layer is more resistant to a selective etchant than the first layer;
disposing at least one electronic device layer above a portion of the first layer and/or the second polymer layer;
applying an adhesive layer to a portion of the second polymer layer prior to disposing the at least one electronic device layer;
forming at least one trench through the second polymer layer and the at least one electronic device layer to expose at least a portion of the first layer; and
exposing at least a portion of the first layer to the selective etchant through the at least one trench to remove portions of the first layer, thereby providing the flexible electronic structure, wherein at least one anchor of the flexible electronic structures contact the substrate; and
separating the flexible electronic structure from the substrate.

38. The method of claim 37, wherein separating the flexible electronic structure from the substrate comprises:
applying a removable medium on a portion of the at least one electronic device layer; and
applying a force to the removable medium to separate the anchors from the substrate.

39. The method of claim 38, wherein the removable medium is selected such that the adhesion strength of the removable medium to the at least one electronic device layer is greater than the adhesion strength of the anchors to the substrate.

40. The method of claim 39, further comprising removing the removable medium by exposure to a solvent, heating, exposure to UV light, or using an oxygen plasma etch.

41. The method of claim 40, wherein the removable medium is removed by exposure to water.

42. The method of claim 38, further comprising exposing the flexible electronic structure on the removable medium to an oxygen plasma, wherein the oxygen plasma removes a portion of the removable medium that is not adhered to the flexible electronic structure.

43. The method of claim 38, further comprising depositing at least one additional electronic device layer on portions of the second polymer layer.

44. The method of claim 38, further comprising exposing the second polymer layer of the flexible electronic structure to an oxygen plasma to create a highly oxygen-terminated surface; and adhering a second substrate to the highly oxygen-terminated surface of the flexible electronic structure.

45. The method of claim 44, further comprising exposing the second substrate to an oxygen plasma to create a highly oxygen-terminated surface; and adhering the highly oxygen-terminated surface of the second substrate to the highly oxygen-terminated surface of the flexible electronic structure.

46. The method of claim 44, wherein the second substrate comprises at least one of a flexible material and a stretchable material.

47. The method of claim 44, wherein the second substrate comprises an elastomeric material, a rubber material, a plastic material, or a fabric.

48. The method of claim 44, wherein the second substrate comprises a silicone-based material.

49. The method of claim 37, wherein the substrate is a rigid substrate.

50. The method of claim 37, wherein the substrate has a higher Young's modulus than the second polymer layer.

51. The method of claim 37, further comprising:
applying a third polymer layer to at least a portion of the at least one electronic device layer; and
forming the at least one trench through the third polymer layer, the second polymer layer, and the at least one electronic device layer to expose at least a portion of the first layer.

52. The method of claim 51, wherein the third polymer layer is applied through a spin coating process, spray coating, lamination, casting, or vapor deposition.

53. The method of claim 51, wherein a thickness of the third polymer layer is configured such that the at least one electronic device layer is at a neutral mechanical plane of the electronic structure.

54. A flexible electronic structure comprising:
a second polymer layer having a first surface and a second surface, wherein the first surface comprises a plurality of anchors; and at least one electronic device layer disposed above the second surface of the second polymer layer,
wherein the electronic structure is fabricated according to the method of claim 37.

\* \* \* \* \*